(12) United States Patent
Lai et al.

(10) Patent No.: US 7,527,985 B2
(45) Date of Patent: May 5, 2009

(54) METHOD FOR MANUFACTURING A RESISTOR RANDOM ACCESS MEMORY WITH REDUCED ACTIVE AREA AND REDUCED CONTACT AREAS

(75) Inventors: Erh-Kun Lai, Longjing Shiang (TW); ChiaHua Ho, Kaoshing (TW); Kuang Yeu Hsieh, Jhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 293 days.

(21) Appl. No.: 11/552,327

(22) Filed: Oct. 24, 2006

(65) Prior Publication Data

US 2008/0096341 A1 Apr. 24, 2008

(51) Int. Cl.
*H01L 21/8239* (2006.01)

(52) U.S. Cl. ............... 438/3; 438/95; 438/238; 438/382; 257/4; 257/E31.029; 257/E21.663; 257/E21.664; 365/145; 365/148

(58) Field of Classification Search ............ 438/3, 438/95, 238, 381, 382, 910; 257/4, 758, 257/E31.029, E21.663, E21.664; 365/145, 365/148, 163
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,599,705 A | 7/1986 | Holmberg et al. | |
| 4,719,594 A | 1/1988 | Young et al. | |
| 4,876,220 A | 10/1989 | Mohsen et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,534,712 A | 7/1996 | Ovshinsky et al. | |
| 5,687,112 A | 11/1997 | Ovshinsky | |
| 5,789,277 A | 8/1998 | Zahorik et al. | |

(Continued)

FOREIGN PATENT DOCUMENTS

WO  WO 00/45108 A1  8/2000

(Continued)

OTHER PUBLICATIONS

Adler, David, "Amorphous-Semiconductor Devices," Sci. Amer., vol. 236, pp. 36-48, May 1977.

(Continued)

*Primary Examiner*—M. Wilczewski
(74) *Attorney, Agent, or Firm*—Haynes Beffel & Wolfeld LLP

(57) ABSTRACT

A method for manufacturing a memory device comprises patterning a dielectric layer and a conductive layer to align near the center of the top surface of a first contact drain plug and near the center of the top surface of a second contact drain plug. A first electrode is formed on the right sidewalls of the patterned dielectric layer and the conductive layer. A sidewall insulating member has a first sidewall surface and a second sidewall surface where the first sidewall surface of the sidewall insulating member is in contact with a sidewall of the first electrode. A second electrode is formed by depositing an electrode layer overlying the top surface of the sidewall insulating member and the second sidewall of the insulating member and isotropically etching the electrode layer to form the second electrode.

25 Claims, 19 Drawing Sheets

U.S. PATENT DOCUMENTS

| | | | |
|---|---|---|---|
| 5,789,758 A | 8/1998 | Reinberg | |
| 5,814,527 A | 9/1998 | Wolstenholme et al. | |
| 5,831,276 A | 11/1998 | Gonzalez et al. | |
| 5,837,564 A | 11/1998 | Sandhu et al. | |
| 5,869,843 A | 2/1999 | Harshfield | |
| 5,879,955 A | 3/1999 | Gonzalez et al. | |
| 5,920,788 A | 7/1999 | Reinberg | |
| 5,952,671 A | 9/1999 | Reinberg et al. | |
| 5,970,336 A | 10/1999 | Wolstenholme et al. | |
| 5,985,698 A | 11/1999 | Gonzalez et al. | |
| 5,998,244 A | 12/1999 | Wolstenholme et al. | |
| 6,011,725 A | 1/2000 | Eitan | |
| 6,025,220 A | 2/2000 | Sandhu | |
| 6,031,287 A | 2/2000 | Harshfield | |
| 6,034,882 A | 3/2000 | Johnson et al. | |
| 6,064,084 A * | 5/2000 | Tanahashi | 257/296 |
| 6,077,729 A | 6/2000 | Harshfield | |
| 6,087,674 A | 7/2000 | Ovshinsky et al. | |
| 6,104,038 A | 8/2000 | Gonzalez et al. | |
| 6,111,264 A | 8/2000 | Wolstenholme et al. | |
| 6,114,713 A | 9/2000 | Zahorik | |
| 6,117,720 A | 9/2000 | Harshfield | |
| 6,147,395 A | 11/2000 | Gilgen | |
| 6,150,253 A | 11/2000 | Doan et al. | |
| 6,153,890 A | 11/2000 | Wolstenholme et al. | |
| 6,177,317 B1 | 1/2001 | Huang et al. | |
| 6,185,122 B1 | 2/2001 | Johnson et al. | |
| 6,189,582 B1 | 2/2001 | Reinberg et al. | |
| 6,236,059 B1 | 5/2001 | Wolstenholme et al. | |
| RE37,259 E | 7/2001 | Ovshinsky | |
| 6,271,090 B1 | 8/2001 | Huang et al. | |
| 6,271,577 B1 * | 8/2001 | Havemann | 257/592 |
| 6,280,684 B1 | 8/2001 | Yamada et al. | |
| 6,287,887 B1 | 9/2001 | Gilgen | |
| 6,314,014 B1 | 11/2001 | Lowrey et al. | |
| 6,320,786 B1 | 11/2001 | Chang et al. | |
| 6,339,544 B1 | 1/2002 | Chiang et al. | |
| 6,351,406 B1 | 2/2002 | Johnson et al. | |
| 6,420,215 B1 | 7/2002 | Knall et al. | |
| 6,420,216 B1 | 7/2002 | Clevenger et al. | |
| 6,420,725 B1 | 7/2002 | Harshfield | |
| 6,423,621 B2 | 7/2002 | Doan et al. | |
| 6,429,064 B1 | 8/2002 | Wicker | |
| 6,462,353 B1 | 10/2002 | Gilgen | |
| 6,483,736 B2 | 11/2002 | Johnson et al. | |
| 6,487,114 B2 | 11/2002 | Jong et al. | |
| 6,501,111 B1 | 12/2002 | Lowrey | |
| 6,511,867 B2 | 1/2003 | Lowrey et al. | |
| 6,512,241 B1 | 1/2003 | Lai | |
| 6,514,788 B2 | 2/2003 | Quinn | |
| 6,534,781 B2 | 3/2003 | Dennison | |
| 6,545,903 B1 | 4/2003 | Wu | |
| 6,555,860 B2 | 4/2003 | Lowrey et al. | |
| 6,563,156 B2 | 5/2003 | Harshfield | |
| 6,566,700 B2 | 5/2003 | Xu | |
| 6,567,293 B1 | 5/2003 | Lowrey et al. | |
| 6,579,760 B1 | 6/2003 | Lung | |
| 6,586,761 B2 | 7/2003 | Lowrey | |
| 6,589,714 B2 | 7/2003 | Maimon et al. | |
| 6,593,176 B2 | 7/2003 | Dennison | |
| 6,597,009 B2 | 7/2003 | Wicker | |
| 6,605,527 B2 | 8/2003 | Dennison et al. | |
| 6,605,821 B1 | 8/2003 | Lee et al. | |
| 6,607,974 B2 | 8/2003 | Harshfield | |
| 6,613,604 B2 | 9/2003 | Maimon et al. | |
| 6,617,192 B1 | 9/2003 | Lowrey et al. | |
| 6,621,095 B2 | 9/2003 | Chiang et al. | |
| 6,627,530 B2 | 9/2003 | Li et al. | |
| 6,639,849 B2 | 10/2003 | Takahashi et al. | |
| 6,673,700 B2 | 1/2004 | Dennison et al. | |
| 6,744,088 B1 | 6/2004 | Dennison | |
| 6,764,897 B2 * | 7/2004 | Lowrey et al. | 438/238 |
| 6,791,102 B2 | 9/2004 | Johnson et al. | |
| 6,797,979 B2 | 9/2004 | Chiang et al. | |
| 6,805,563 B2 | 10/2004 | Xu | |
| 6,815,704 B1 | 11/2004 | Chen | |
| 6,859,389 B2 * | 2/2005 | Idehara | 365/163 |
| 6,861,267 B2 | 3/2005 | Xu et al. | |
| 6,864,500 B2 | 3/2005 | Gilton | |
| 6,864,503 B2 | 3/2005 | Lung | |
| 6,867,638 B2 | 3/2005 | Saiki et al. | |
| 6,888,750 B2 | 5/2005 | Walker et al. | |
| 6,894,305 B2 | 5/2005 | Yi et al. | |
| 6,909,107 B2 | 6/2005 | Rodgers et al. | |
| 6,927,410 B2 | 8/2005 | Chen | |
| 6,933,516 B2 | 8/2005 | Xu | |
| 6,936,840 B2 | 8/2005 | Sun et al. | |
| 6,937,507 B2 | 8/2005 | Chen | |
| 6,969,866 B1 * | 11/2005 | Lowrey et al. | 257/3 |
| 6,992,932 B2 | 1/2006 | Cohen | |
| 7,132,675 B2 * | 11/2006 | Gilton | 257/3 |
| 7,166,533 B2 * | 1/2007 | Happ | 438/637 |
| 7,227,171 B2 * | 6/2007 | Bez et al. | 257/3 |
| 7,238,994 B2 * | 7/2007 | Chen et al. | 257/379 |
| 7,321,130 B2 * | 1/2008 | Lung et al. | 257/4 |
| 7,365,354 B2 * | 4/2008 | Maimon | 257/2 |
| 7,385,235 B2 * | 6/2008 | Lung | 257/246 |
| 7,388,771 B2 * | 6/2008 | Ho et al. | 365/148 |
| 7,440,308 B2 * | 10/2008 | Jeong et al. | 365/148 |
| 7,459,717 B2 * | 12/2008 | Lung | 257/4 |
| 2004/0248339 A1 | 12/2004 | Lung | |
| 2005/0215009 A1 | 9/2005 | Cho | |
| 2007/0045728 A1 * | 3/2007 | Lee | 257/340 |
| 2007/0152205 A1 * | 7/2007 | Chen | 257/4 |
| 2007/0158690 A1 * | 7/2007 | Ho et al. | 257/209 |
| 2007/0161186 A1 * | 7/2007 | Ho | 438/257 |
| 2007/0224726 A1 * | 9/2007 | Chen et al. | 438/102 |
| 2007/0278529 A1 * | 12/2007 | Lai et al. | 257/209 |
| 2007/0281420 A1 * | 12/2007 | Lai et al. | 438/253 |
| 2008/0096341 A1 * | 4/2008 | Lai et al. | 438/210 |
| 2008/0138929 A1 * | 6/2008 | Lung | 438/102 |

FOREIGN PATENT DOCUMENTS

| WO | WO 00/79539 A1 | 12/2000 |
|---|---|---|
| WO | WO 01/45108 A1 | 6/2001 |

OTHER PUBLICATIONS

Adler, D. et al., "Threshold Switching in Chalcogenide-Glass Thin Films," J. Appl/ Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al, "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

"Magnetic Bit Boost," www.sciencenews.org, Dec. 18 & 25, 2004, p. 389, vol. 166.

Mott, Nevill, "Electrons in Glass," Nobel Lecture, Dec. 8, 1977, Physics, 1977, pp. 403-413.

"New Memories Tap Spin, Gird for Battle," Science News, Apr. 3, 1999, p. 223, vol. 155.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel μTrench Phase-Change Memory Cell for Embedded and Stand-Alone Non-Volatile Memory Applications," 2004 Symposium on VLSI Technology Digest of Technical Papers, pp. 18-19.

Pirovano, Agostino et al., "Reliability Study of Phase-Change Nonvolatile Memories," IEEE Transactions on Device and Materials Reliability, Sep. 2004, pp. 422-427, vol. 4, No. 3.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org, Mar. 19, 2005, p. 189, vol. 167.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.
PDF#search='nonvolatile%20high%20density%20high%20 performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

US 7,527,985 B2

METHOD FOR MANUFACTURING A RESISTOR RANDOM ACCESS MEMORY WITH REDUCED ACTIVE AREA AND REDUCED CONTACT AREAS

CROSS REFERENCE TO RELATED APPLICATIONS

This application relates to co-pending U.S. patent application Ser. No. 11/421,042, entitled "Resistor Random Access Memory Cell with Reduced Active Area and Reduced Contact Areas", by Erh-Kun Lai et al.; and Ser. No. 11/421,036, entitled "Resistor Random Access Memory Cell with L-Shaped Electrode" by Erh-Kun Lai et al., both of which are owned by the assignee of this application and incorporated herein by reference

BACKGROUND OF THE INVENTION

1. Field of the Invention

The present invention relates to high density memory devices based on phase change based memory materials, including chalcogenide based materials and other materials, and to methods for manufacturing such devices.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, can also be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and of the contact area between electrodes and the phase change material, so that higher current densities are achieved with small absolute current values through the phase change material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Problems have arisen in manufacturing such devices with very small dimensions, and with variations in process that meet tight specifications needed for large-scale memory devices. Contacts in a resistance memory device can occupy a significant amount of space. It is therefore desirable to provide a memory cell structure that reduces the dimension of contacts resulting in an overall reduction in the size of a memory cell.

SUMMARY OF THE INVENTION

A phase change random access memory PCRAM device is described suitable for use in large-scale integrated circuits. Technology described herein includes a memory device which has a sidewall insulating member with a sidewall insulating member length according to a first spacer layer thickness. A first electrode formed from a second spacer layer having a first electrode length according to a thickness of a second spacer layer and a second electrode formed from the second spacer layer having a second electrode length according to the thickness of the second spacer layer are formed on sidewalls of the sidewall insulating member. A bridge of memory material having a bridge width extends from the top surface of the first electrode to the top surface of the second electrode across the top surface of the sidewall insulating member, wherein the bridge comprises memory material.

The inter-electrode path across the insulating wall, formed by the sidewall insulating member between the first and second electrodes, has a path length defined essentially by the thickness of the first spacer layer. The bridge comprises a programmable resistive material. For the phase change memory, the bridge comprises memory material having at least two solid phases that are reversible, such as a chalcogenide-based material or other related material, by applying a current through the material or applying a voltage across the first and second electrodes.

The active volume of memory material subject of programmable resistance can be very small. For the purpose of this disclosure, when referring to the dimensions of the structures in the cell, the "length" refers to the distance in the x-direction (left to right in FIG. 3), which for the sidewall spacer insulating member and the sidewall electrodes, is determined by the thicknesses of the first electrode and spacer layers used to form the sidewalls. The "thickness" of a structure in the cell refers to distance in the y-direction (up and down in FIG. 3), and the "width" refers to distance in the z-direction (perpendicular to the plane of the drawing in FIG. 3). Thus the active volume of memory material is determined by the length of the sidewall insulating member (x-direction), the thickness of the thin film used to form the bridge (y-direction), the width of the bridge orthogonal to the conductive path length (z-direction), and the length of the sidewall electrode structures (x-direction) acting as contacts to the bridge. The small contact areas, defined by the lengths of the first and second electrodes and the width of the bridge, improve thermal isolation of the bridge by reducing the area of contact to the electrode material which has relatively high thermal conductivity. The small contact areas also serve to concentrate current flow, increasing current density in the bridge. The improved thermal isolation and increased current density improve reset operation of the cell, particularly for cells comprising bridges of phase change material.

The length of the electrode structures and the thickness of the thin film of memory material used to form the bridge are determined in embodiments of the technology by thin film thicknesses which are not limited by the lithographic processes used in manufacturing the memory cell. Optionally, the width of the bridge is also smaller than a minimum feature size F that is specified for a lithographic process used in patterning the layer of material in embodiments of the present invention. In one embodiment, the width of the bridge is defined using photoresist trimming technologies in which a mask pattern is used to define a lithographical photoresist structure on the chip having the minimum feature size F, and the photoresist structure is trimmed by isotropic etching to achieve a feature size less than F. The width and thickness of the bridge, implemented either as GST or resistive film, are preferably, in this embodiment, as narrow and as thin as possible, thereby producing better power consumption. Also, other techniques can be used to form narrow lines of material in a layer on an integrated circuit. Accordingly, a phase change memory cell with simple structure achieves very small reset current and low power consumption, and is easily manufactured.

In some embodiments of the technology described herein, an array of memory cells is provided. In the array, a plurality of electrode members and sidewall spacer insulating members therebetween comprise a planarized interface in an integrated circuit. The corresponding plurality of thin film bridges across the sidewall spacer insulating members between pairs of electrode members comprises memory elements on the top surfaces of the electrode layer and sidewall spacer insulating members. A current path from a first electrode through a thin film bridge on the top surface of the sidewall spacer insulating member to a second electrode is established for memory cells in the array.

Circuitry below the electrode layer on integrated circuits described herein can be implemented using well understood technology for logic circuitry and memory array circuitry, such as CMOS technology.

Also, in one array embodiment described herein, circuitry above the electrode layer includes a plurality of bit lines. In an embodiment having bit lines above the electrode layer that is described herein, electrode members that act as second electrodes for a memory cell are shared so that a single bit line contacts multiple second electrodes, and hence multiple memory cells. Also, in an embodiment that is described herein, bit lines in the plurality of bit lines are arranged along corresponding columns in the array, and two adjacent memory cells in the corresponding columns share a contact structure for contacting said second electrodes.

A method for manufacturing a memory device is also described A first dielectric layer is deposited over a memory common source array structure. A conductive layer comprising a material such as titanium nitride is formed over the first dielectric layer, and a second dielectric layer is formed over the conductive layer. The second dielectric layer and the conductive layer are patterned and aligned near the center of the top surface of a first contact drain plug and near the center of the top surface of a second contact drain plug. A first electrode comprising an electrode material such as titanium nitride extends vertically and is formed on the right sidewalls of the patterned second dielectric layer and the conductive layer. A sidewall insulating member has a first sidewall surface and a second sidewall surface where the first sidewall surface of the sidewall insulating member is in contact with a sidewall of the first electrode. A second electrode is formed by depositing an electrode layer overlying the top surface of the sidewall insulating member and the second sidewall of the insulating member and isotropically etching the electrode layer to form the second electrode. A bridge of memory material is formed between the first electrode and the second electrode across the top surface of the insulating sidewall spacer layer. The bridge comprises a patch of memory material contacting the top surface of the first electrode and the top surface of the second electrode to define an inter-electrode path between the first electrode and second electrode having a path length defined by a thickness of the insulating sidewall spacer layer.

Advantageously, the present invention reduces the amount of thermal dissipation and operation current with a reduced contact area between an electrode and a programmable resistive memory material and a thinner dielectric material disposed between two electrodes.

The structures and methods relating to the present invention are disclosed in the detailed description below. This summary does not purport to define the invention. The invention is defined by the claims. These and other embodiments, features, aspects, and advantages of the invention will become better understood with regard to the following description, appended claims and accompanying drawings.

BRIEF DESCRIPTION OF THE DRAWINGS

The invention will be described with respect to specific embodiments thereof and reference will be made to the drawings, in which.

DETAILED DESCRIPTION

Figure 1:
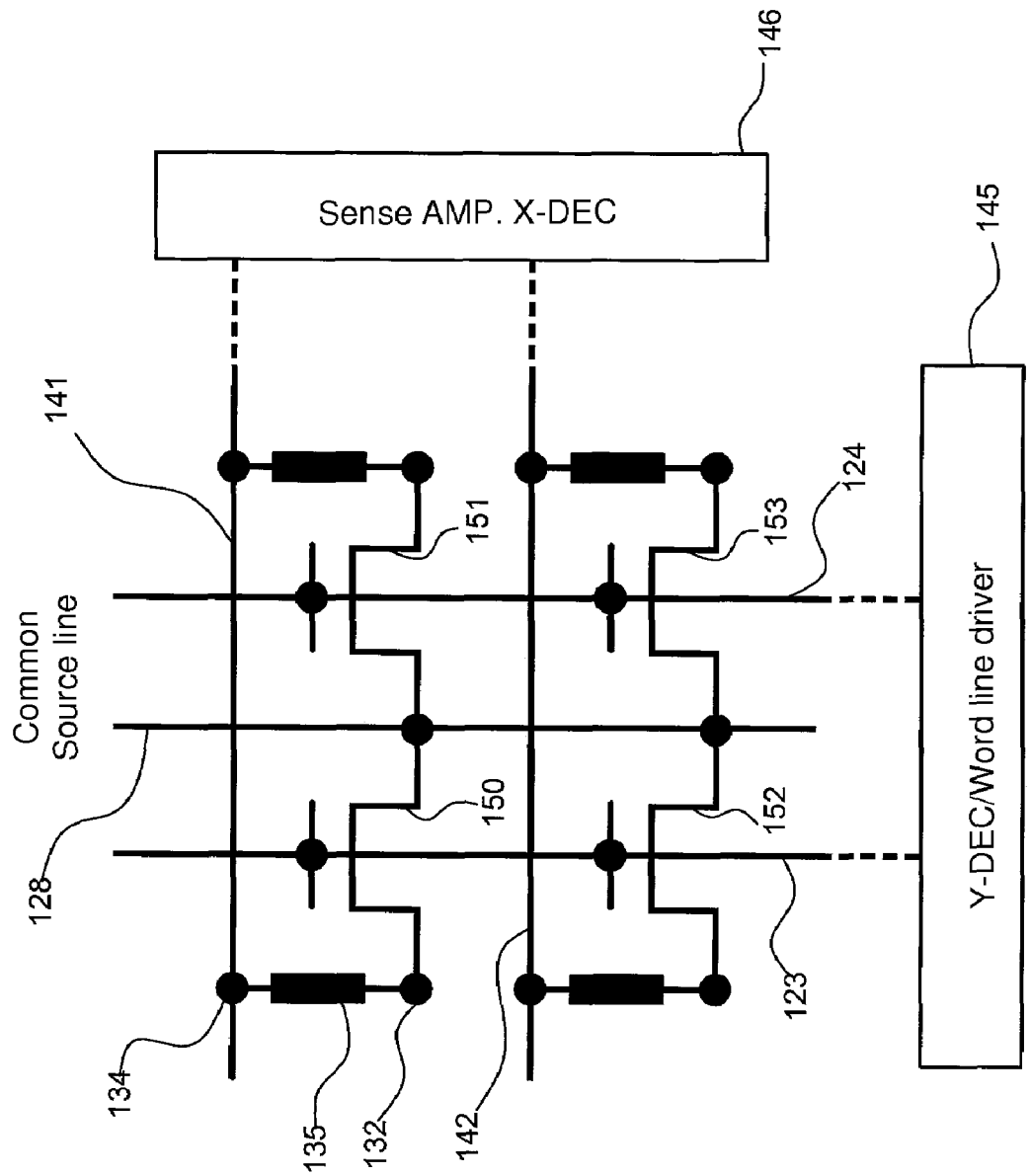
FIG. 1 is a schematic diagram of a bistable resistance random access memory array in accordance with the present invention.

A description of structural embodiments and methods of the present invention is provided with reference to FIGS. 1-19. It is to be understood that there is no intention to limit the invention to the specifically disclosed embodiments but that the invention may be practiced using other features, elements, methods and embodiments. Like elements in various embodiments are commonly referred to with like reference numerals.

Referring now to FIG. 1, there is shown a schematic illustration of a memory array 100, which can be implemented as described herein. In the schematic illustration of FIG. 1, a common source line 128, a word line 123 and a word line 124 are arranged generally parallel in the Y-direction. Bit lines 141 and 142 are arranged generally parallel in the X-direction. Thus, a Y-decoder and a word line driver in a block 145 are coupled to the word lines 123, 124. An X-decoder and a set of sense amplifiers in block 146 are coupled to the bit lines 141 and 142. The common source line 128 is coupled to the source terminals of access transistors 150, 151, 152 and 153. The gate of access transistor 150 is coupled to the word line 123. The gate of access transistor 151 is coupled to the word line 124. The gate of access transistor 152 is coupled to the word line 123. The gate of access transistor 153 is coupled to the word line 124. The drain of access transistor 150 is coupled to the bottom electrode member 132 for memory cell 135, which has top electrode member 134 and a bottom electrode member 132. The top electrode member 134 is coupled to the bit line 141. It can be seen that the common source line 128 is shared by two rows of memory cells, where a row is arranged in the Y-direction in the illustrated schematic. In other embodiments, the access transistors can be replaced by diodes, or other structures for controlling current flow to selected devices in the array for reading and writing data.

Figure 2:
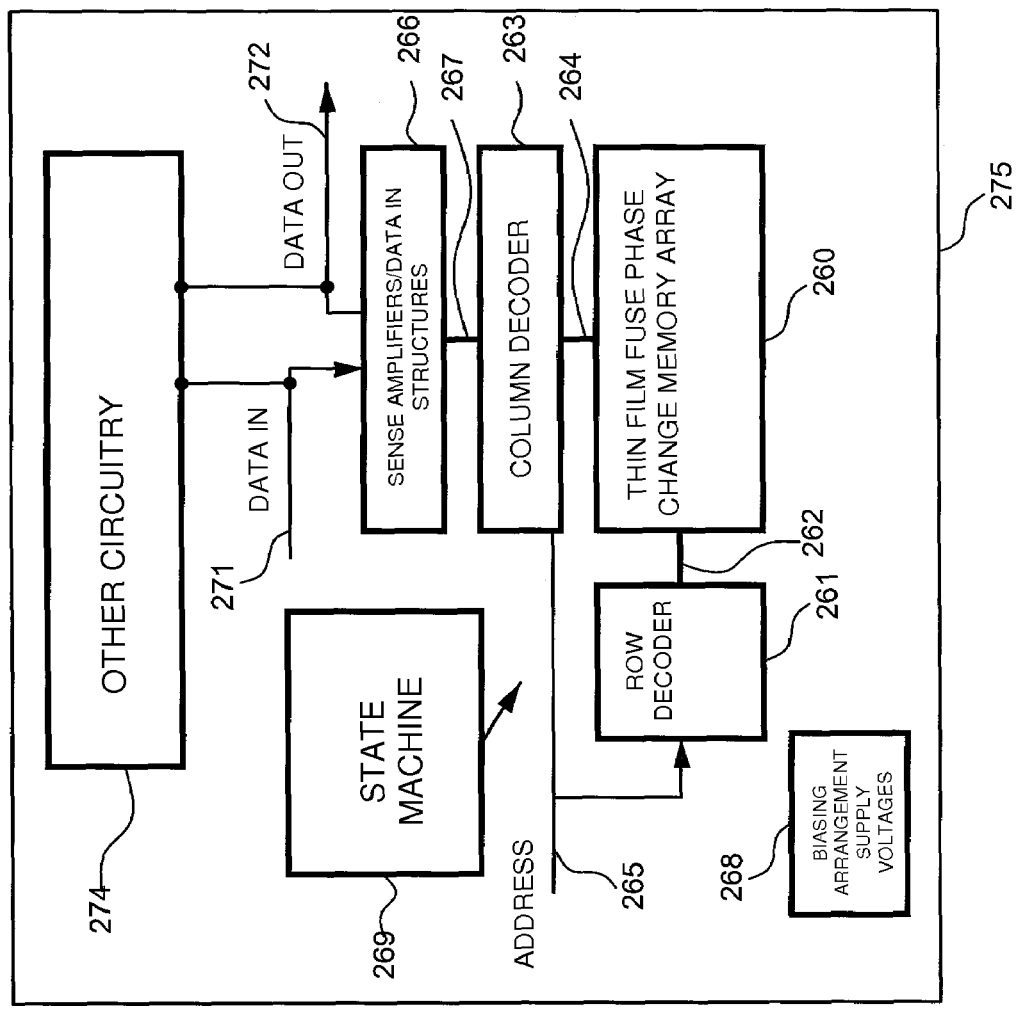
FIG. 2 is a simplified block diagram of an integrated circuit in accordance with an embodiment of the present invention.

As illustrated in FIG. 2, there is shown a simplified block diagram of an integrated circuit 200 according to an embodiment of the present invention. The integrated circuit 275 includes a memory array implemented using bistable resistance random access memory cells, on a semiconductor substrate. A row decoder 261 is coupled to a plurality of word lines 262, and arranged along rows in the memory array 260. A column decoder 263 is coupled to a plurality of bit lines 264 arranged along pins in the memory array 260 for reading and programming data from the memory cells in the memory array 260. Addresses are supplied on a bus 265 to a column decoder 263 and a row decoder 261. Sense amplifiers and data-in structures in a block 266 are coupled to the column decoder 263 via a data bus 267. Data is supplied via the data-in line 271 from input/output ports on the integrated circuit 275 or from other data sources internal or external to the integrated circuit 275, to the data-in structures in the block 266. In the illustrated embodiment, other circuitry 274 is included on the integrated circuit 275, such as a general purpose processor or special purpose application circuitry, or a combination of modules providing system-on-a-chip functionality supported by the thin film fuse bistable resistance random access memory cell array. Data is supplied via the data-out line 272 from the sense amplifiers in block 266 to input/output ports on the integrated circuit 275, or to other data destinations internal or external to the integrated circuit 275.

A controller implemented in this example using bias arrangement state machine 269 controls the application of bias arrangement supply voltages 268, such as read, program, erase, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 3A:
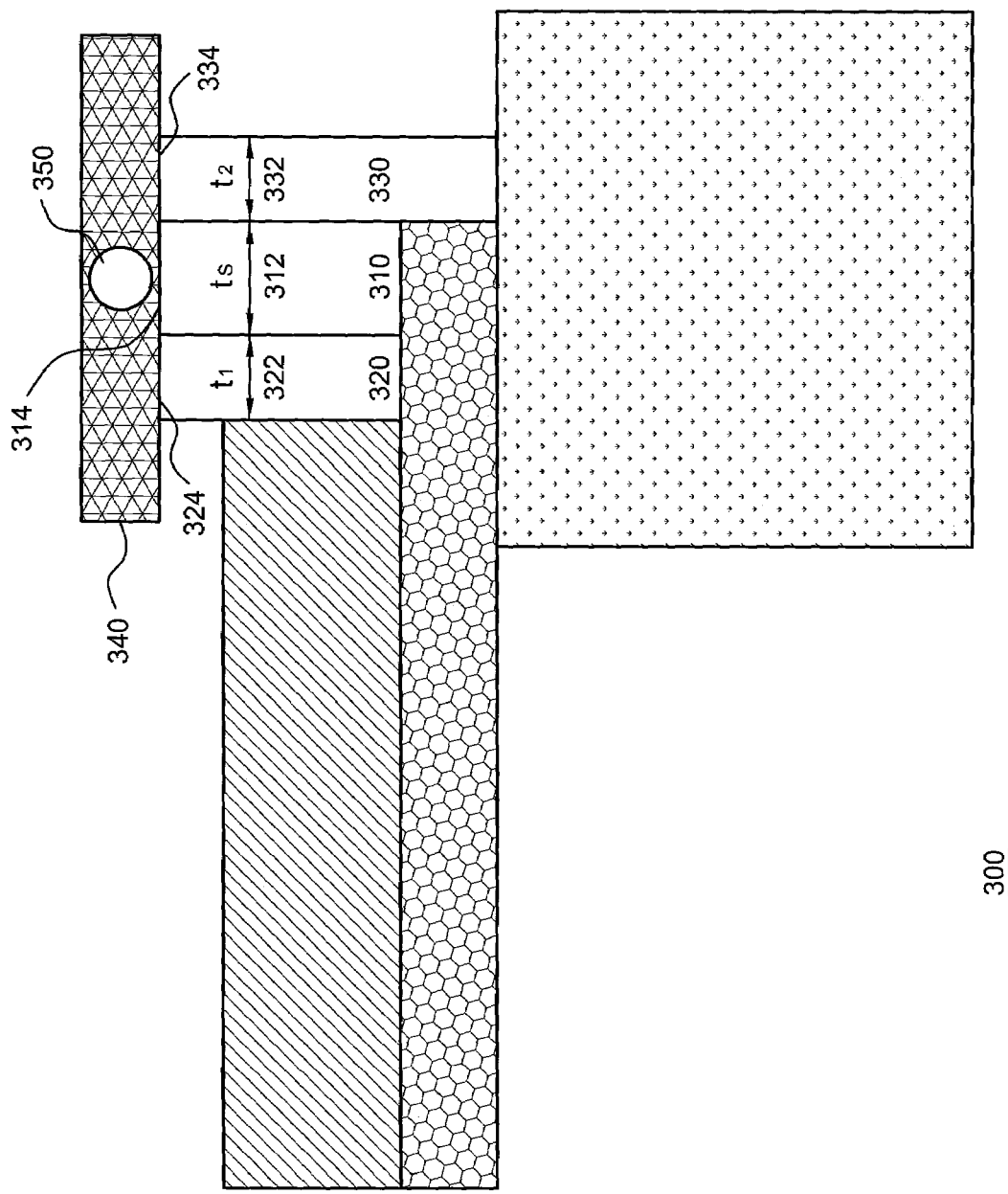
FIG. 3A illustrates a compact memory cell structure including a sidewall insulating member separating a first electrode and a second electrode in accordance with the present invention.

FIG. 3A illustrates a compact memory cell structure 300 including a sidewall insulating member 310 separating a first electrode 320 and a second electrode 330. A bridge 340 has a bottom surface that extends across the top surface of the first electrode 320, the top surface of the sidewall insulating member 310, and the top surface of the second electrode 330. The bridge 340 comprises a memory material, such as programmable resistive material. The sidewall insulating member 310 extends vertically and provides a narrower gap separating the first electrode 320 and the second electrode 330. The sidewall insulating member 310 has a first sidewall insulating length $t_s$, measured between a first sidewall and a second sidewall and represented by a double-ended arrow 312. The first electrode 320 has a sidewall in contact with the first sidewall of the sidewall insulating member 310, and has a first electrode length $t_1$, represented by a double-ended arrow 322. A second electrode 330 has a sidewall in contact with the second sidewall of the sidewall insulating member 310 and has a second electrode length $t_1$, represented by a double-ended arrow 332.

The first and second electrodes 320, 330 and the sidewall insulating member comprise thin film sidewall structures. As illustrated, the first and second electrodes 320, 330 have top surfaces 324, 334 that contact the bridge 340 at electrode contact areas, which are essentially the areas defined by the width of the bridge and the lengths 322, 332 of the electrodes. The lengths of the electrodes are defined by the thickness of the electrode layer. Likewise, the sidewall insulating member 310 has the top surface 314, and the bridge 340 has an active region 350, represented by a dashed line, generally the length 312 of the sidewall insulating member 310. The active region 350 of the bridge 340 represents the active volume of memory material that switches states during programming and resetting of the memory. The bridge 340 of memory material lies on the planar top surface 324, 334 of the electrode layers 320, 330, and the planar top surface 314 of the sidewall insulating member 310 so that contacts between the first electrode 320 and the bridge 340 and between the second electrode 340 and the bridge 340 are made on the bottom side of the bridge.

The active volume of memory material subject of programmable resistance (i.e. active region 350) can be very small, determined by the length of the sidewall insulating member, which is a result of the deposited layer thickness and the etch process. In a particular embodiment, the sidewall insulating member is a ring of dielectric material deposited on the sidewall of a plug, or pillar, of sacrificial material, and is formed similarly to gate sidewalls, which are well known in the art of metal-oxide-semiconductor field-effect transistor fabrication. The length of the electrode structures, which are also formed using sidewall techniques, the length of the sidewall insulating member, and the thickness of the layer of memory material used to form the bridge 340 are determined in embodiments of the technology by thin film thicknesses, and are not limited by the minimum feature size F of photolithographic processes used in the manufacturing of the memory cell. In a particular embodiment, the width of the bridge is also smaller than a minimum feature size F that is specified for a lithographic process used in patterning the layer of material in embodiments of the present invention. In one embodiment, the width of the bridge is defined using photoresist trimming technologies in which a mask pattern is used to define a lithographical photoresist structure on the chip having the minimum feature size F, and the photoresist structure is trimmed by isotropic etching to achieve a feature size less than F. The trimmed photoresist structure is then used to lithographically transfer the narrowed pattern onto the layer of memory material. Also, other techniques can be used to form narrow lines of material in a layer on an integrated circuit. Accordingly, a phase change memory cell with a simple structure achieves very small reset current and low power consumption, and is easily manufactured. The width and thickness of the bridge, implemented either as GST or resistive film, are preferably, in this embodiment, as narrow and as thin as possible, thereby producing better power consumption.

In operation, a current path ("inter-electrode path") from the first electrode 320, through the active region 350 of the bridge 340, to the second electrode 330 is formed by the memory cell structure. Access circuitry can be utilized to contact the first electrode 320 and the second electrode 330 in a variety of configurations for controlling the operation of the memory cell, so that it can be programmed to set the bridge 340 with a programmable resistance to indicate a data value. For example, using a chalcogenide-based phase change memory material, the memory cell may be set to a relatively high resistivity state in which at least a portion of the bridge in the current path is in an amorphous state, and a relatively low resistivity state, in which all or most of the bridge in the current path is in a crystalline state.

The active region 350 of the cell 300 is the region for a phase change memory cell embodiment in which the material is induced to change between the at least two solid phases. As can be appreciated, the active region 350 can be made extremely small in the illustrated structure, reducing the magnitude of current needed to induce the phase changes.

Embodiments of the memory cell include phase change based memory materials, including chalcogenide based materials and other materials, for the bridge 102. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_2$, (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys can be switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including $N_2$ doped GST, $Ge_xSb_y$, or other material that uses different crystal phase changes to determine resistance; $Pr_xCa_yMnO_3$, $PrSrMnO_3$, ZrOx, or other material that uses an electrical pulse to change the resistance state; 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, C60-TCNQ, TCNQ doped with other metal, or any other polymer material that has bistable or multi-stable resistance state controlled by an electrical pulse.

The following are short summaries describing four types of resistive memory material. The first type is chalcogenide material, such as $Ge_xSb_yTe_z$ where x:y:z=2:2:5, or other compositions with x: 0~5; y: 0~5; z: 0~10. GeSbTe with doping, such as N—, Si—, Ti—, or other element doping is alternatively used.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually performed at room temperature. A collimater with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously.

A post-deposition annealing treatment in vacuum or in an $N_2$ ambient is optionally performed to improve the crystallize state of chalcogenide material. The annealing temperature typically ranges from 100° C. to 400° C. with an annealing time of less than 30 minutes.

The thickness of chalcogenide material depends on the design of the cell structure. In general, a chalcogenide material with thickness of higher than 8 nm can have a phase change characterization so that the material exhibits at least two stable resistance states.

A second type of memory material suitable for use in embodiments is colossal magnetoresistance ("CMR") material, such as $Pr_xCa_yMnO_3$ where x:y=0.5:0.5, or other compositions with x: 0~1; y: 0~1. CMR material that includes Mn oxide is alternatively used.

An exemplary method for forming CMR material uses PVD sputtering or magnetron-sputtering method with source gases of Ar, $N_2$, $O_2$, and/or He, etc. at the pressure of 1 mTorr~100 mTorr. The deposition temperature can range from room temperature to ~600° C., depending on the post-deposition treatment condition. A collimater with an aspect ratio of 1~5 can be used to improve the fill-in performance. To improve the fill-in performance, the DC bias of several tens of volts to several hundreds of volts is also used. On the other hand, the combination of DC bias and the collimater can be used simultaneously. A magnetic field of several tens of Gauss to as much as a Tesla (10,000 Gauss) may be applied to improve the magnetic crystallized phase.

A post-deposition annealing treatment in vacuum or in an $N_2$ ambient or $O_2/N_2$ mixed ambient is optionally used to improve the crystallized state of CMR material. The annealing temperature typically ranges from 400° C. to 600° C. with an annealing time of less than 2 hours.

The thickness of CMR material depends on the design of the cell structure. The CMR thickness of 10 nm to 200 nm can be used for the core material. A buffer layer of YBCO (YBaCuO$_3$, which is a type of high temperature superconductor material) is often used to improve the crystallized state of CMR material. The YBCO is deposited before the deposition of CMR material. The thickness of YBCO ranges from 30 nm to 200 nm.

A third type of memory material is two-element compounds, such as $Ni_xO_y$; $Ti_xO_y$; $Al_xO_y$; $W_xO_y$; $Zn_xO_y$; $Zr_xO_y$; $Cu_xO_y$; etc, where x:y=0.5:0.5, or other compositions with x: 0~1; y: 0~1. An exemplary formation method uses a PVD sputtering or magnetron-sputtering method with reactive gases of Ar, $N_2$, $O_2$, and/or He, etc. at the pressure of 1 mTorr~100 mTorr, using a target of metal oxide, such as $Ni_xO_y$; $Ti_xO_y$; $Al_xO_y$; $W_xO_y$; $Zn_xO_y$; $Zr_xO_y$; $Cu_xO_y$; etc. The deposition is usually performed at room temperature. A collimater with an aspect ratio of 1~5 can be used to improve the fill-in performance. To improve the fill-in performance, the DC bias of several tens of volts to several hundreds of volts is also used. If desired, the combination of DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an annealing time of less than 2 hours.

An alternative formation method uses a PVD sputtering or magnetron-sputtering method with reactive gases of $Ar/O_2$, $Ar/N_2/O_2$, pure $O_2$, $He/O_2$, $He/N_2/O_2$ etc. at the pressure of 1 mTorr~100 mTorr, using a target of metal oxide, such as Ni, Ti, Al, W, Zn, Zr, or Cu etc. The deposition is usually performed at room temperature. A collimater with an aspect ratio of 1~5 can be used to improve the fill-in performance. To improve the fill-in performance, a DC bias of several tens of volts to several hundreds of volts is also used. If desired, the combination of DC bias and the collimater can be used simultaneously.

A post-deposition annealing treatment in vacuum or in an $N_2$ ambient or $O_2/N_2$ mixed ambient is optionally performed to improve the oxygen distribution of metal oxide. The annealing temperature ranges from 400° C. to 600° C. with an annealing time of less than 2 hours.

Yet another formation method uses oxidation by a high temperature oxidation system, such as a furnace or a rapid thermal pulse ("RTP") system. The temperature ranges from 200° C. to 700° C. with pure $O_2$ or $N_2/O_2$ mixed gas at a pressure of several mTorr to 1 atm. The time can range several minutes to hours. Another oxidation method is plasma oxidation. An RF or a DC source plasma with pure $O_2$ or $Ar/O_2$ mixed gas or $Ar/N_2/O_2$ mixed gas at a pressure of 1 mTorr to 100 mTorr is used to oxidize the surface of metal, such as Ni, Ti, Al, W, Zn, Zr, or Cu etc. The oxidation time ranges several seconds to several minutes. The oxidation temperature ranges from room temperature to 300° C., depending on the degree of plasma oxidation.

A fourth type of memory material is a polymer material, such as TCNQ with doping of Cu, $C_{60}$, Ag etc. or PCBM-TCNQ mixed polymer. One formation method uses evaporation by thermal evaporation, e-beam evaporation, or molecular beam epitaxy ("MBE") system. A solid-state TCNQ and dopant pellets are co-evaporated in a single chamber. The solid-state TCNQ and dopant pellets are put in a W-boat or a Ta-boat or a ceramic boat. A high electrical current or an electron-beam is applied to melt the source so that the materials are mixed and deposited on wafers. There are no reactive chemistries or gases. The deposition is performed at a pressure of $10^{-4}$ Torr to $10^{-10}$ Torr. The wafer temperature ranges from room temperature to 200° C.

A post-deposition annealing treatment in vacuum or in an $N_2$ ambient is optionally performed to improve the composition distribution of polymer material. The annealing temperature ranges from room temperature to 300° C. with an annealing time of less than 1 hour.

Another technique for forming a layer of polymer-based memory material is to use a spin-coater with doped-TCNQ solution at a rotation of less than 1000 rpm. After spin-coating, the wafer is held (typically at room temperature or temperature less than 200° C.) for a time sufficient for solid-state formation. The hold time ranges from several minutes to days, depending on the temperature and on the formation conditions.

Figure 3B:
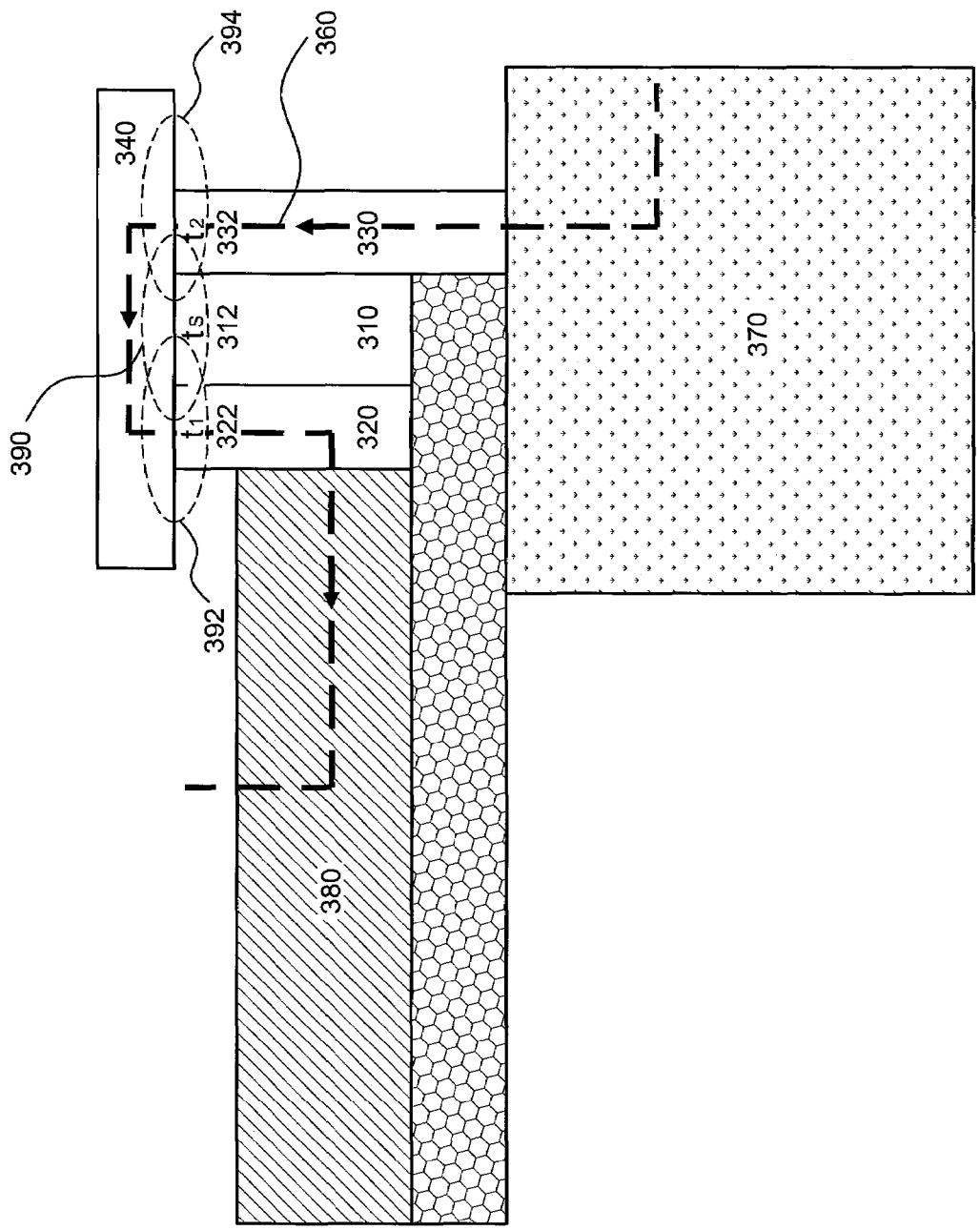
FIG. 3B illustrates a sample current path flowing through the compact memory cell structure in accordance with the present invention.

FIG. 3B illustrates a sample current path flowing through the compact memory cell structure 300. A sample current path 360 flows in a direction as indicated by arrows from a tungsten plug 370, through the second electrode 330, through the bridge 340, through the first electrode 320 and through a titanium nitride layer 380. The first sidewall insulating length $t_s$ 312 shows a relatively small space 390 in the width that separates the first electrode 320 and the second electrode 330. The first electrode length 322 $t_1$ defines a relatively small contact 392 that is contact with the bridge 340. The second electrode length 332 $t_2$ defines a relatively small contact 394 that is contact with the bridge 340.

Figure 4:
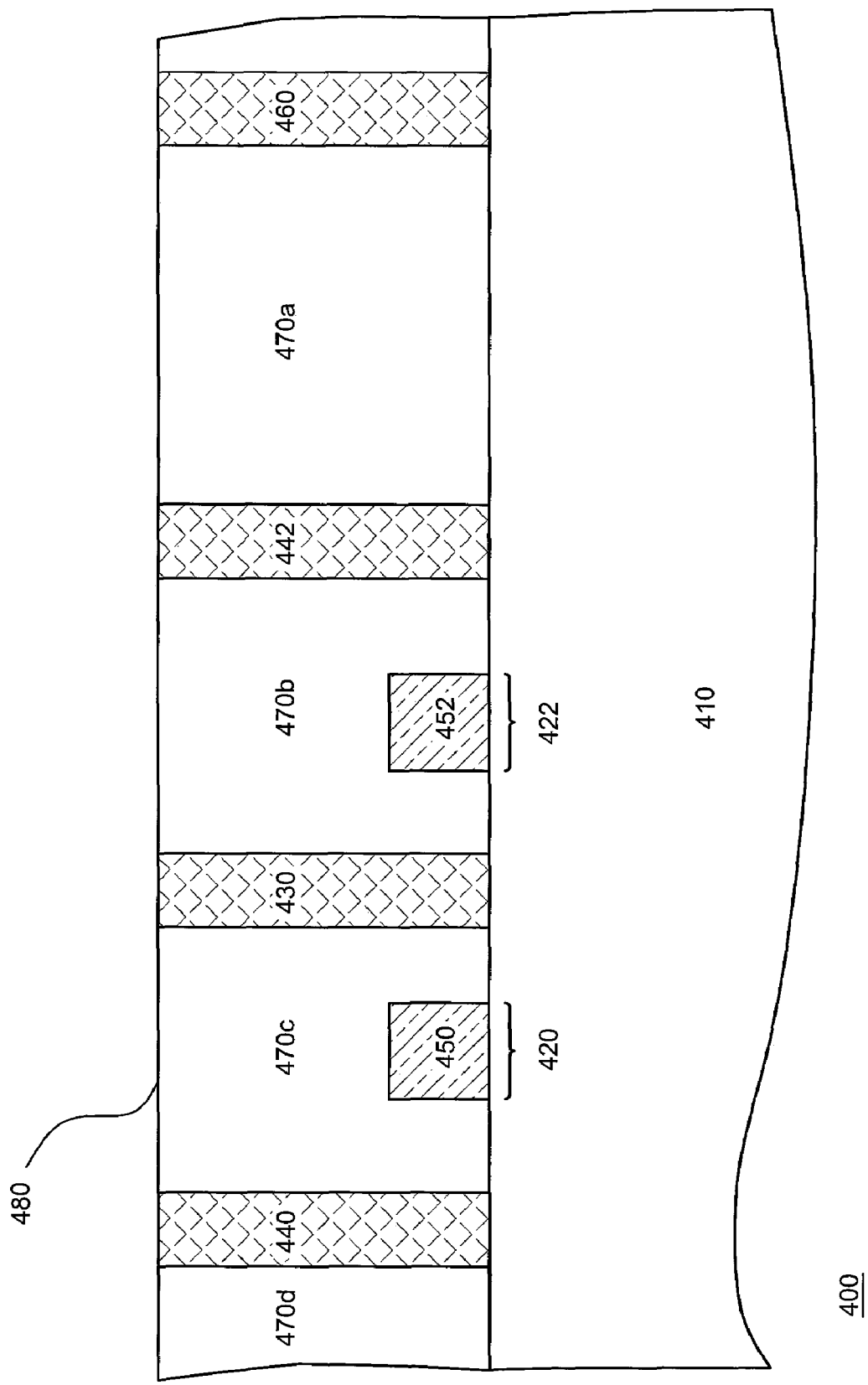
FIG. 4 is a cross-sectional view of a process diagram showing a first step in the manufacturing of a bistable resistive random access memory with the formation of a partially fabricated memory array in a memory common source array transistor structure in accordance with the present invention.

A method in the manufacturing of the bistable resistive random access memory 300 is discussed with reference to FIGS. 4-19. FIG. 4 is a cross-sectional view of a process diagram showing a first step in the manufacturing of a bistable resistive random access memory with the formation of a partially fabricated memory array in a memory common source array transistor structure 400. The bistable resistive random access memory is formed on a semiconductor substrate 410. First and second transistors 420, 422, which in some applications are commonly referred to as "access transistors," have a common source contact 430. A first drain contact 440, and a second drain contact 442, which in a particular embodiment are all tungsten plugs, coupled to n+ doped regions in the substrate, but are alternatively other metals or other conductors, such as doped silicon or silicide, or combinations of conductive materials.

Gates 450, 452 form conductive channels electrically coupling the source contact 430 and drain contacts 440, 442 according to electronic signals applied to the gates, as is well understood in the art of field-effect transistor operation. A peripheral contact 460 is similar to the other contact plugs. Insulating materials 470a-470d separate the contacts 430, 440, 442 and 460, and the gates 450, 452. The insulating material 470a-470d and plugs 430, 440, 442 and 460 have been planarized to form a surface 480 suitable for subsequent processing steps, as is well known in the art of semiconductor fabrication. In a particular embodiment, the semiconudctor has been processed to this stage using conventional CMOS fabrication techniques, which may include additional features that are omitted for simplicity and clarity of illustration.

Figure 5:
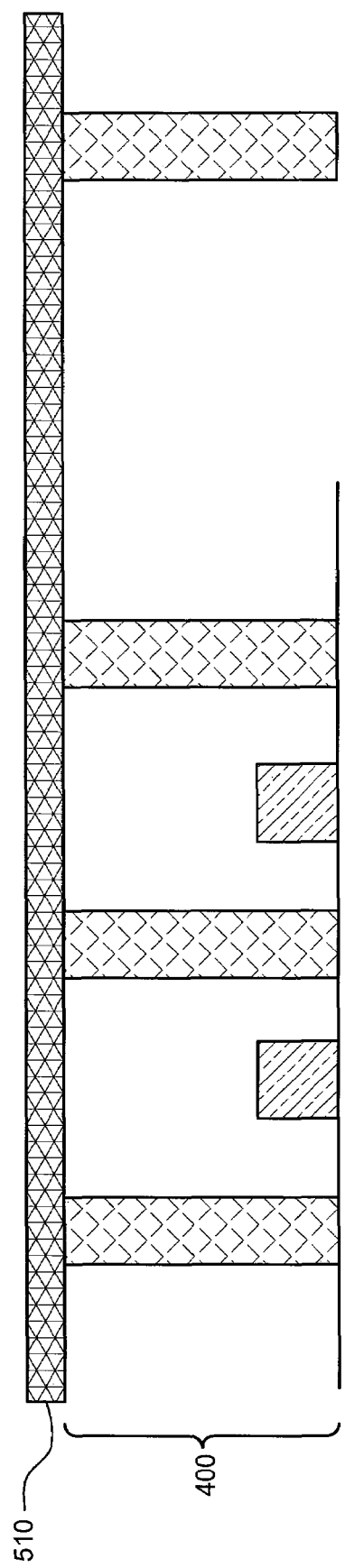
FIG. 5 is a cross-sectional view of a process diagram showing a second step in the manufacturing of the bistable resistive random access memory with the formation of a first silicon nitride layer overlying the memory common source array transistor structure in accordance with the present invention.
Figure 6:
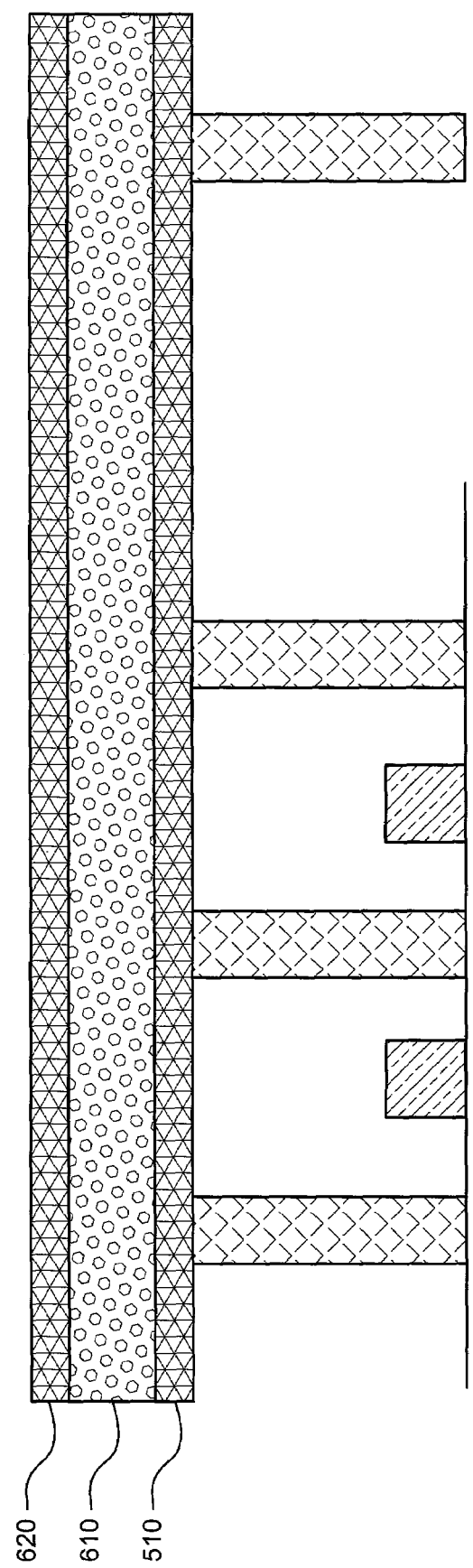
FIG. 6 is a cross-sectional view of a process diagram showing a third step in the manufacturing of the bistable resistive random access memory with the deposition of a titanium nitride layer and a second silicon nitride layer in accordance with the present invention.

FIG. 5 is a cross-sectional view of a process diagram showing a second step in the manufacturing of the bistable resistive random access memory with the formation of a first dielectric layer 510, comprising a material such as silicon nitride, overlying the memory common source array transistor structure 400. The first dielectric layer 510 is deposited over the memory common source array transistor structure 400 with a thickness that ranges from about 100 Å to about 1000 Å. FIG. 6 is a cross-sectional view of a process diagram showing a third step in the manufacturing of the bistable resistive random access memory with the deposition of a conductive layer 610 such as titanium nitride and a second dielectric layer 620 comprising a material such as silicon nitride. The conductive layer 610 overlays the first dielectric layer 510. An example of a suitable thickness of the conductive layer 610 is about 200 Å to 2000 Å. The second dielectric layer 620 overlays the conductive layer 610 with a thickness that is about the same as the first dielectric layer 510, ranging from about from 100 Å to 1000 Å. In one embodiment, the layer 510 and layer 620 are made with the same material and same thickness for better process control.

Figure 7:
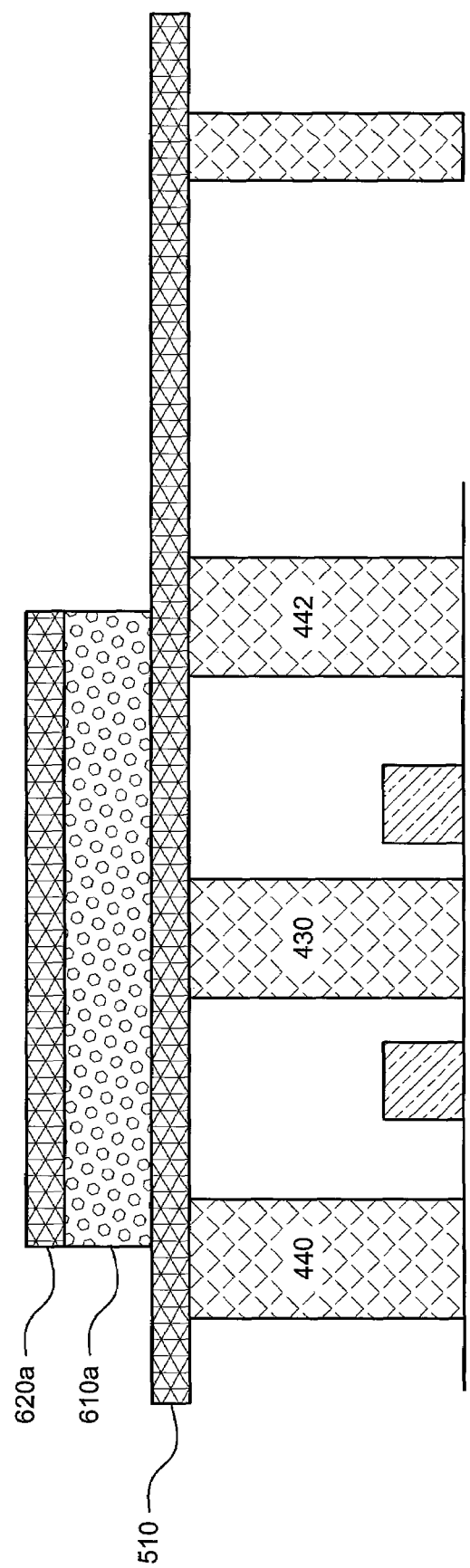
FIG. 7 is a cross-sectional view of a process diagram showing a fourth step in the manufacturing of the bistable resistive random access memory with the patterning of the second silicon nitride layer and the titanium nitride layer in accordance with the present invention

FIG. 7 is a cross-sectional view of a process diagram showing a fourth step in the manufacturing of the bistable resistive random access memory with the patterning of the second dielectric layer 620 and the titanium nitride layer 610. Each side of the second dielectric layer 620 and the titanium nitride layer 610 is patterned to form a reduced length of the second dielectric layer 620a overlaying the a reduced length of the conductive layer 610a. The etching of the second dielectric layer 620 and the titanium layer 610 stops at the top surface of the first silicon nitride layer 510. The reduced second dielectric layer 620a and the reduced second conductive layer 610a have left edges that protrude over and above a portion of the drain contact 440, and align near the center of the top surface of the drain contact 440. The reduced second dielectric layer 620a and the reduced second conductive layer 610a have right edges that protrude over and above a portion of the drain contact 442, and align near the center of the top surface of the drain contact 442.

Figure 8:
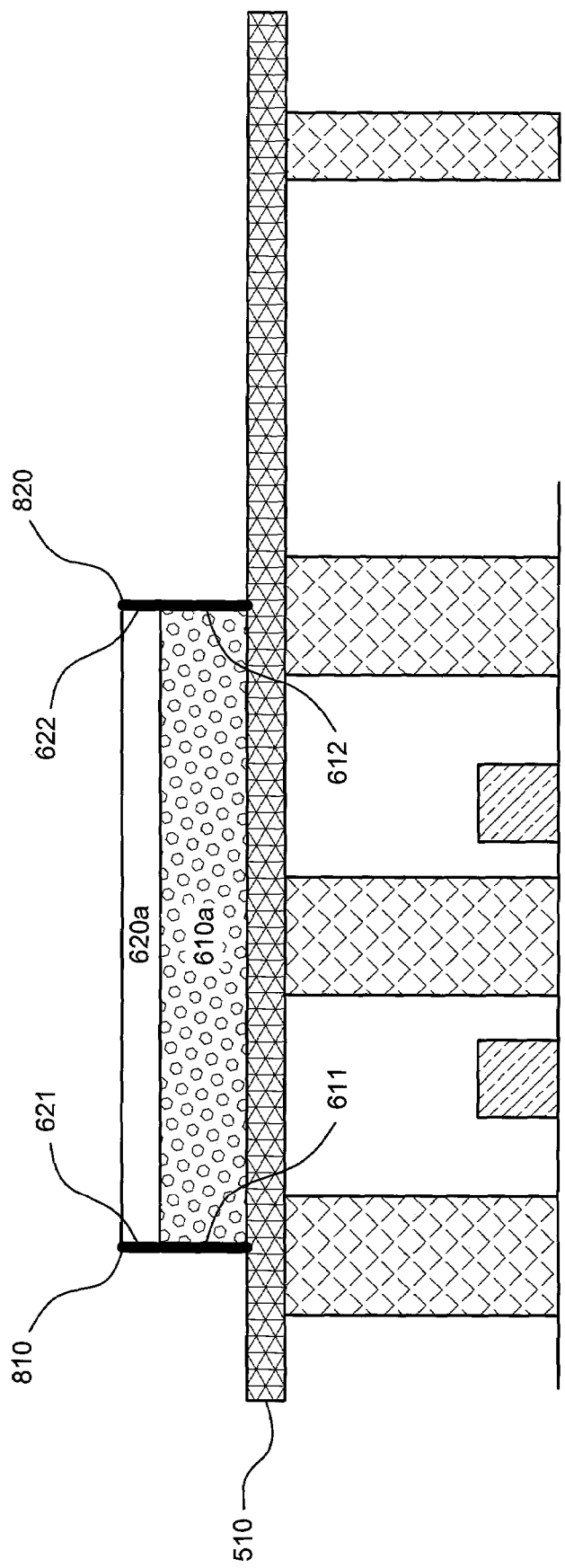
FIG. 8 is a cross-sectional view of a process diagram showing a fifth step in the manufacturing of the bistable resistive random access memory with the formation of pillars on sidewalls of the second silicon nitride layer and the titanium layer in accordance with the present invention.

FIG. 8 is a cross-sectional view of a process diagram showing a fifth step in the manufacturing of the bistable resistive random access memory with the formation of pillars on sidewalls of the second dielectric layer 620a and the conductive layer 610a. A titanium liner is deposited on the sidewalls of the second dielectric layer 620a and the conductive layer 610a and over the top surface of the of the first silicon nitride layer 510 and over the top surface of the second dielectric layer 620a. The titanium liner is etched to form a first pillar 810 and a second pillar 820. The first pillar 810 has a sidewall surface that is in contact with a left sidewall 621 of the second dielectric layer 620a and a left sidewall 611 of the titanium layer 610a. The first pillar 810 establishes an electrical connection by having a side surface that is in contact with the second dielectric layer 620a and a bottom surface that is in contact with the first silicon nitride layer 510. The second pillar 820 has a sidewall surface that is in contact with a right sidewall 622 of the second dielectric layer 620a and a right sidewall 612 of the titanium layer 610a. The second pillar 820 establishes an electrical connection by having a side surface that is in contact with the second dielectric layer 620a and a bottom surface that is in contact with the first silicon nitride layer 510. Suitable materials for the first and second pillars 810, 820 include titanium nitride. The pillars 810, 820 typically have a thickness of about 50 Å to 500 Å; however, these values are merely exemplary.

Figure 9:
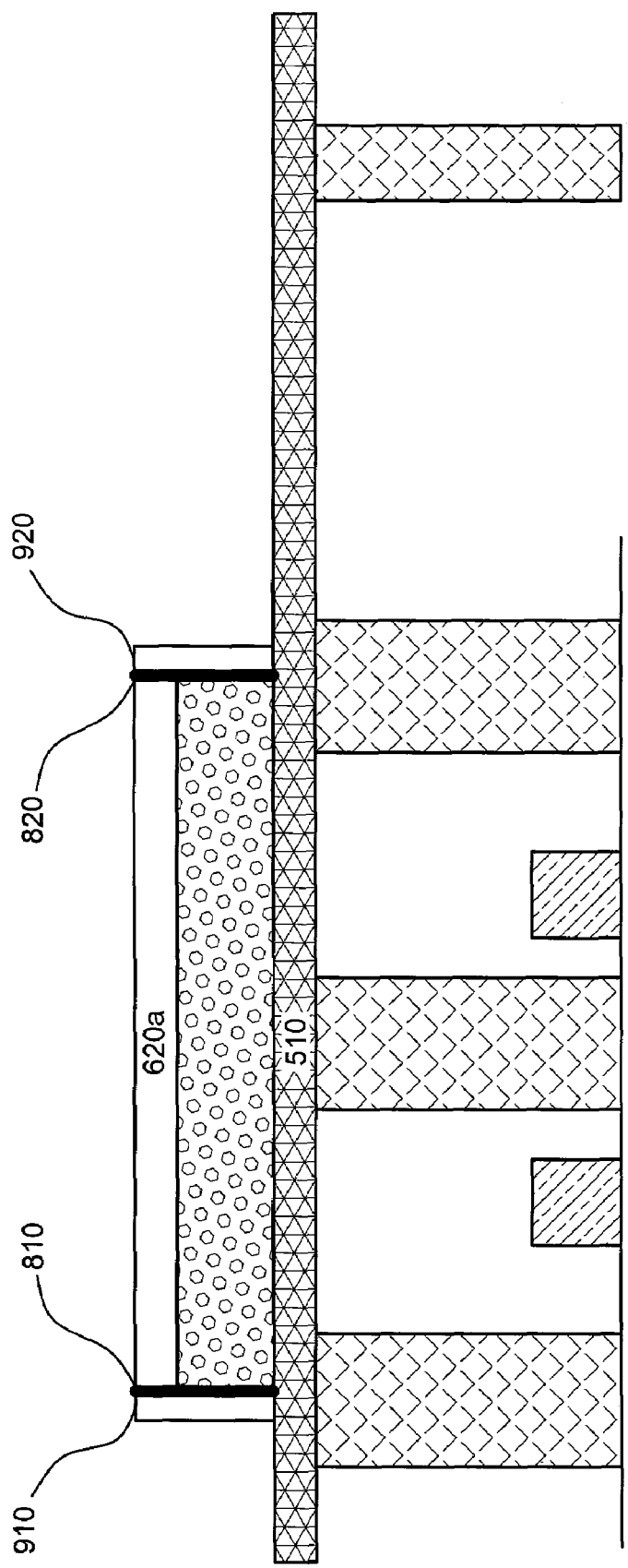
FIG. 9 is a cross-sectional view of a process diagram showing a sixth step in the manufacturing of the bistable resistive random access memory with the deposition and etching of dielectric spacers in accordance with the present invention.

FIG. 9 illustrates a cross-sectional view of a process diagram showing a sixth step in the manufacturing of the bistable resistive random access memory with the deposition and etching of sidewall insulating members (also referred to as dielectric spacers) 910, 920. A dielectric layer is deposited over the second dielectric layer 620a and sidewalls of the first and second pillars 810, 820 and the first dielectric layer 510. The dielectric layer is etched to form a sidewall insulating member 910 and a sidewall insulating member 920. The first and second sidewall insulating members 910, 920 can be formed using a material such as oxide and have a thickness of about 50 Å to 500 Å.

Figure 10:
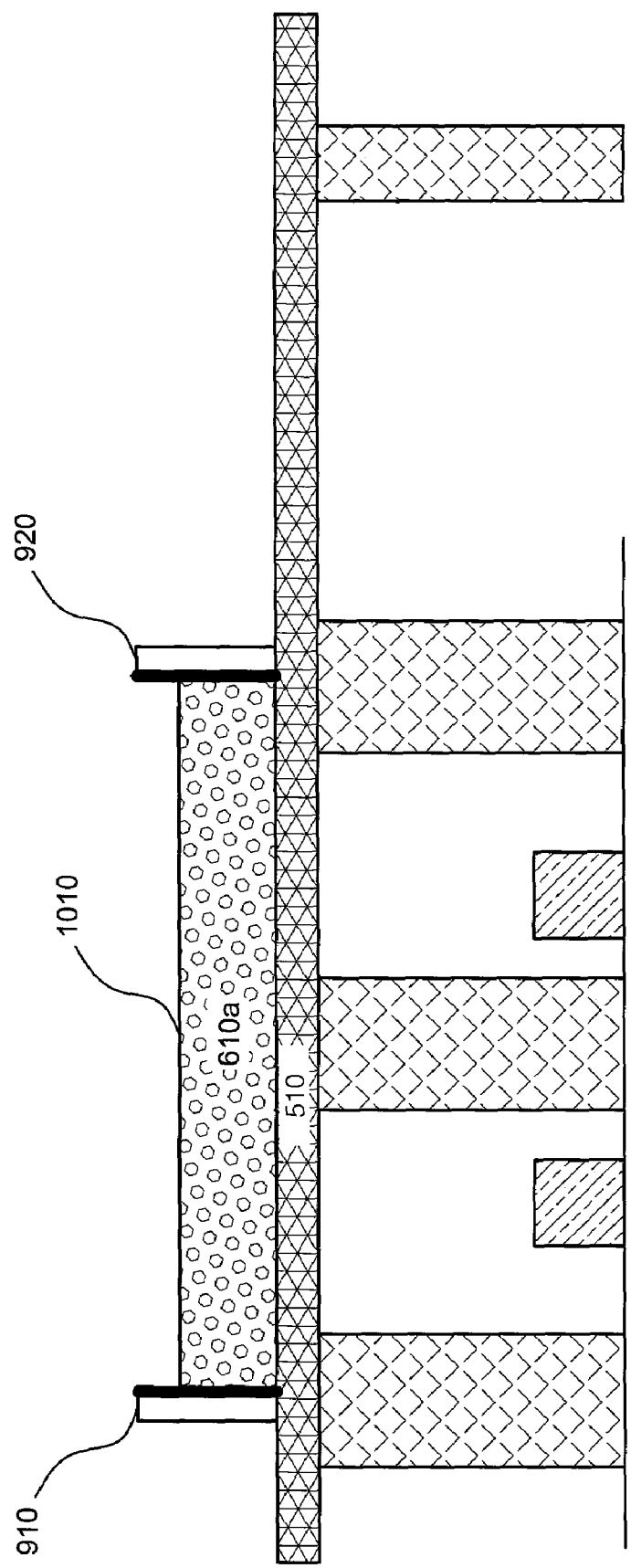
FIG. 10 is a cross-sectional view of a process diagram showing a seventh step in the manufacturing of the bistable resistive random access memory with etching of silicon nitride layers in accordance with the present invention.

FIG. 10 is a cross-sectional view of a process diagram showing a seventh step in the manufacturing of the bistable resistive random access memory with etching of silicon nitride layers. In a particular embodiment, the first dielectric layer 510 and the dielectric layer 610a have the same or substantially the same thickness so that the etching process is able to remove both the first dielectric layer 510 and the dielectric layer 620a at the same time. As shown in FIG. 10, the second dielectric layer 620a that overlies the conductive layer 610a with the top surface 1010 has been removed, as well as a left portion of the first dielectric layer 510 that extends beyond the sidewall insulating member 910 and a right portion of the first dielectric layer 510 that extends beyond the second dielectric spacer 920.

Figure 11:
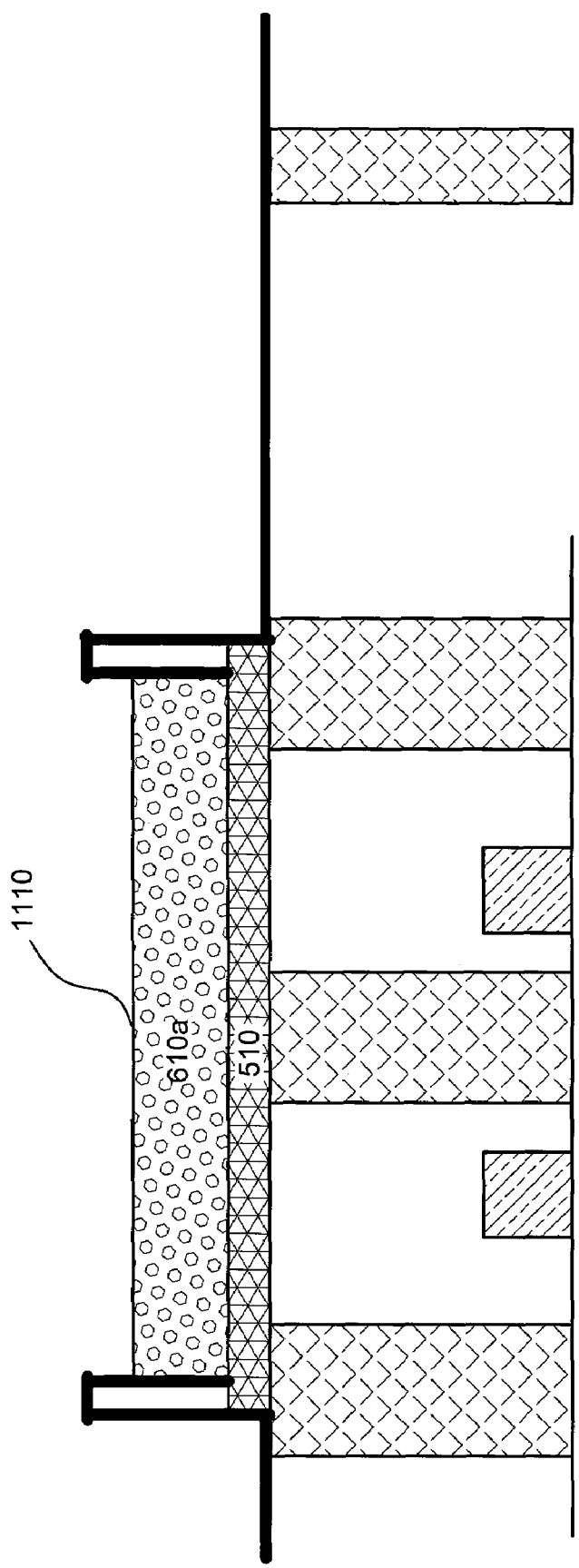
FIG. 11 is a cross-sectional view of a process diagram showing an eighth step in the manufacturing of the bistable resistive random access memory with the deposition of titanium nitride in accordance with the present invention.

FIG. 11 is a cross-sectional view of a process diagram showing an eighth step in the manufacturing of the bistable resistive random access memory with the deposition of titanium nitride. The first and second pillars 810, 820 comprising titanium nitride have been previously formed as shown in FIG. 8. In this step, titanium nitride 1110 is deposited across top and side surfaces of the titanium nitride 610a, the first pillar 810, the sidewall insulating member 910, the second pillar 820, the second dielectric spacer 920, and the memory common source array transistor structure 400. An example of a suitable thickness for forming? the titanium nitride 1110 is about 50 Å to 500 Å.

Figure 12:
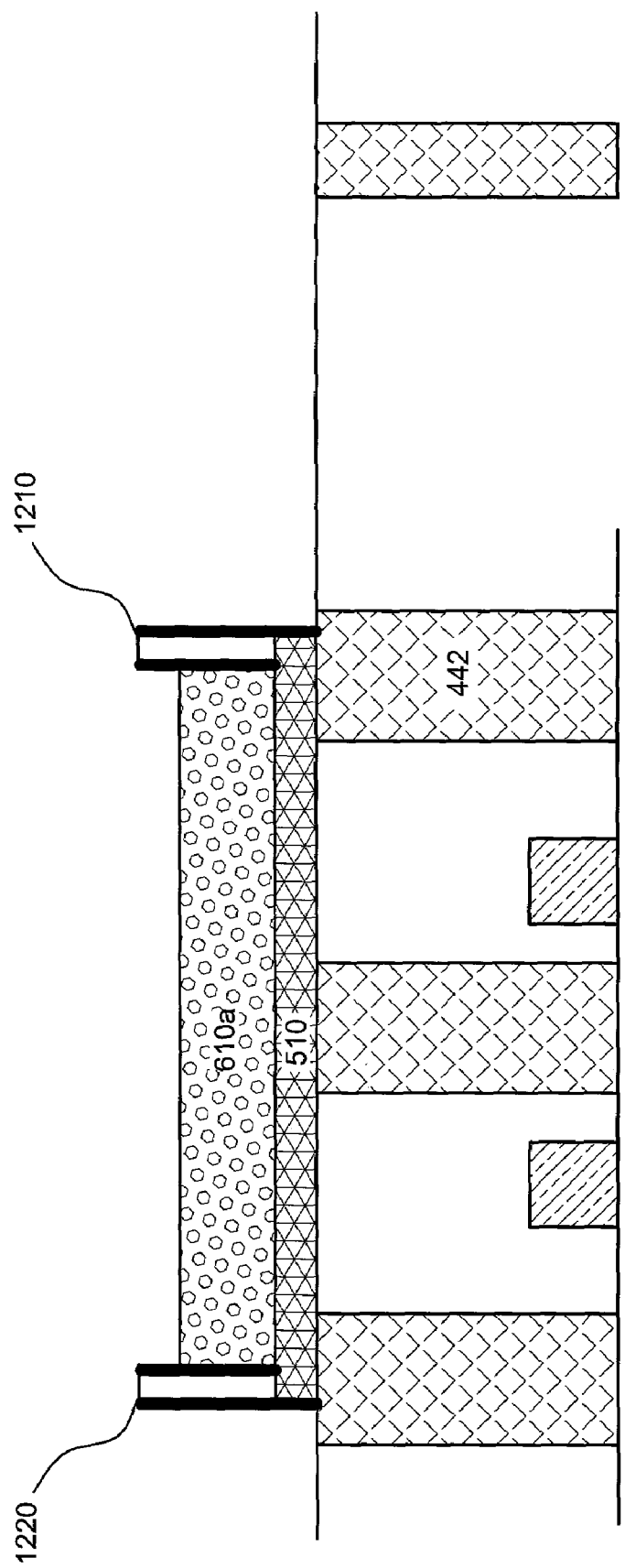
FIG. 12 is a cross-sectional view of a process diagram showing an eighth step in the manufacturing of the bistable resistive random access memory with an isotropical etch to form a titanium spacer in accordance with the present invention.

FIG. 12 is a cross-sectional view of a process diagram showing an eighth step in the manufacturing of the bistable resistive random access memory with an isotropic etch to form a titanium spacer (a second electrode) 1210, 1220. An isotropic (identical in all directions) etch removes titanium nitride that overlies the titanium nitride 610a, the first and second dielectric spacers 910, 920, and the memory common source array transistor structure 400, leaving titanium spacers (second electrodes) 1210, 1220. The second electrode 1210 has a bottom surface that is in contact with the drain contact 442. As described in FIG. 7, the alignment of the right edges of the reduced second dielectric layer 620a and the reduced second conductive layer 610a near the center of the top surface of the drain contact 442 allows the second electrode 1210 to be placed over and in contact with the drain contact 442.

Figure 13:
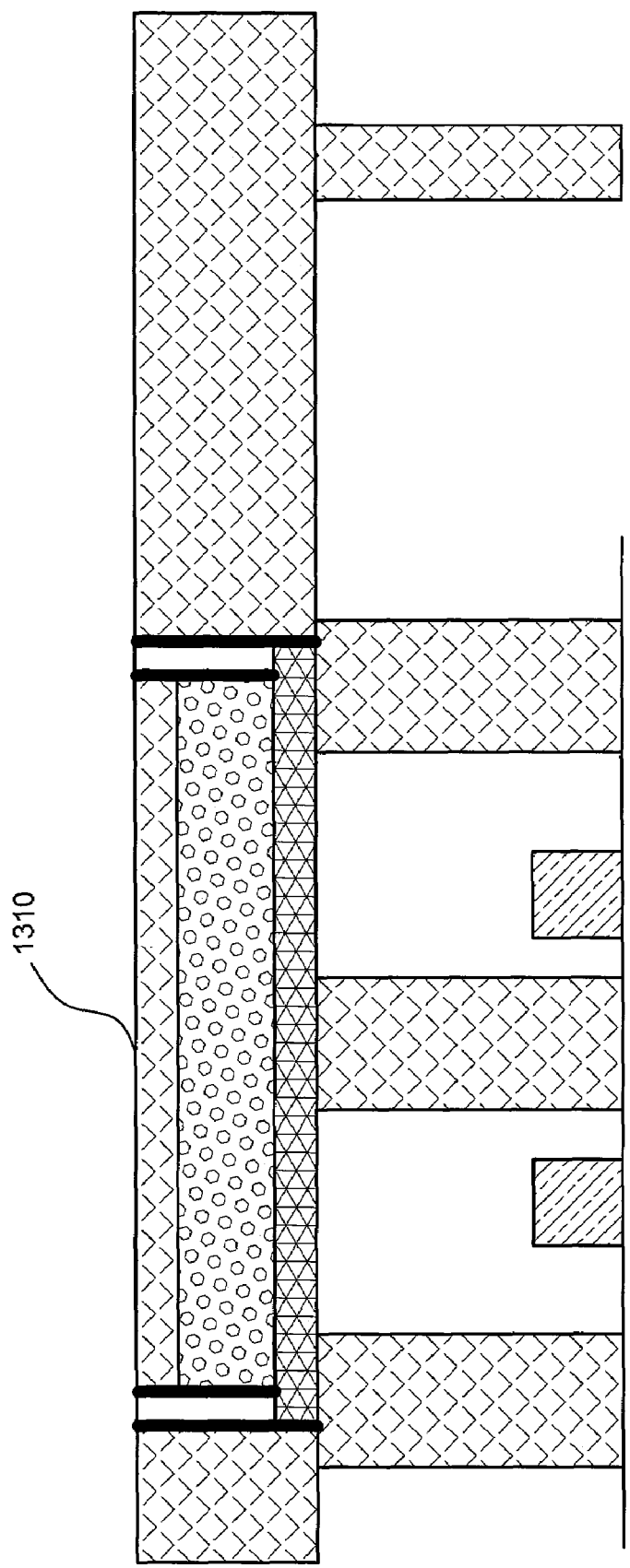
FIG. 13 is a cross-sectional view of a process diagram showing a ninth step in the manufacturing of the bistable resistive random access memory with the deposition of an oxide and chemical vapor deposition in accordance with the present invention.

FIG. 13 illustrates a cross-sectional view of a process diagram showing a ninth step in the manufacturing of the bistable resistive random access memory with the deposition of an oxide 1310 and chemical vapor deposition. The oxide 1310 is deposited to fill up across from the memory common source array transistor structure 400 where the top surface of the oxide 1310 is polished. Embodiments of the process for polishing include a chemical mechanical polishing process, followed by brush clean and liquid and or gas clean procedures, as known in the art.

Figure 14:
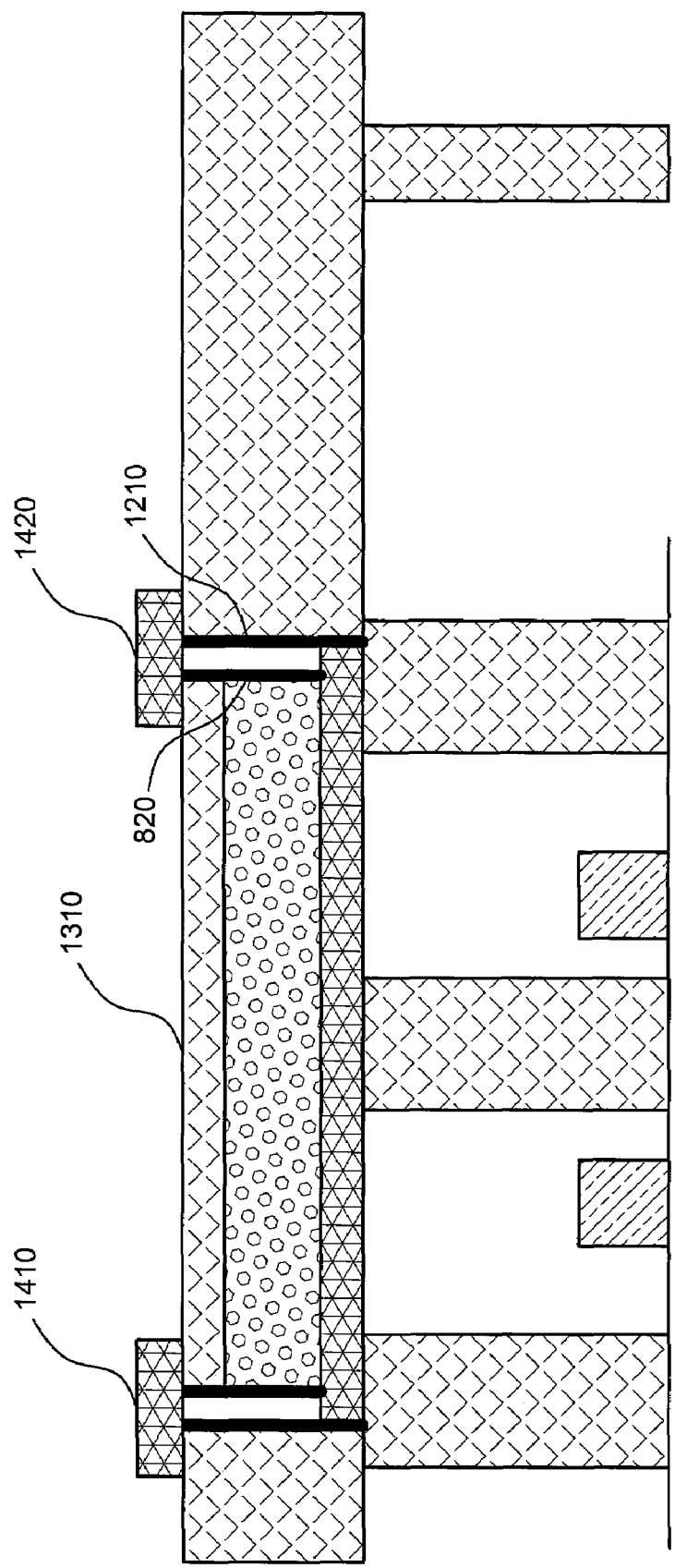
FIG. 14 is a cross-sectional view of a process diagram showing a tenth step in the manufacturing of the bistable resistive random access memory with the deposition and etching of a programmable resistive material in accordance with the present invention.

FIG. 14 illustrates a cross-sectional view of a process diagram showing a tenth step in the manufacturing of the bistable resistive random access memory with the deposition and etching of a programmable resistive material. The term "programmable resistive material" is also referred to as a resistor film. A programmable resistive material layer is deposited over the oxide 1310 followed by etching of the programmable resistive material layer to form a first programmable resistive material segment 1410 and a second programmable resistive material segment 1420. The etching is carried out to etch away programmable resistive material on each side of the first and second programmable resistive material segments 1410, 1420.

Figure 15:
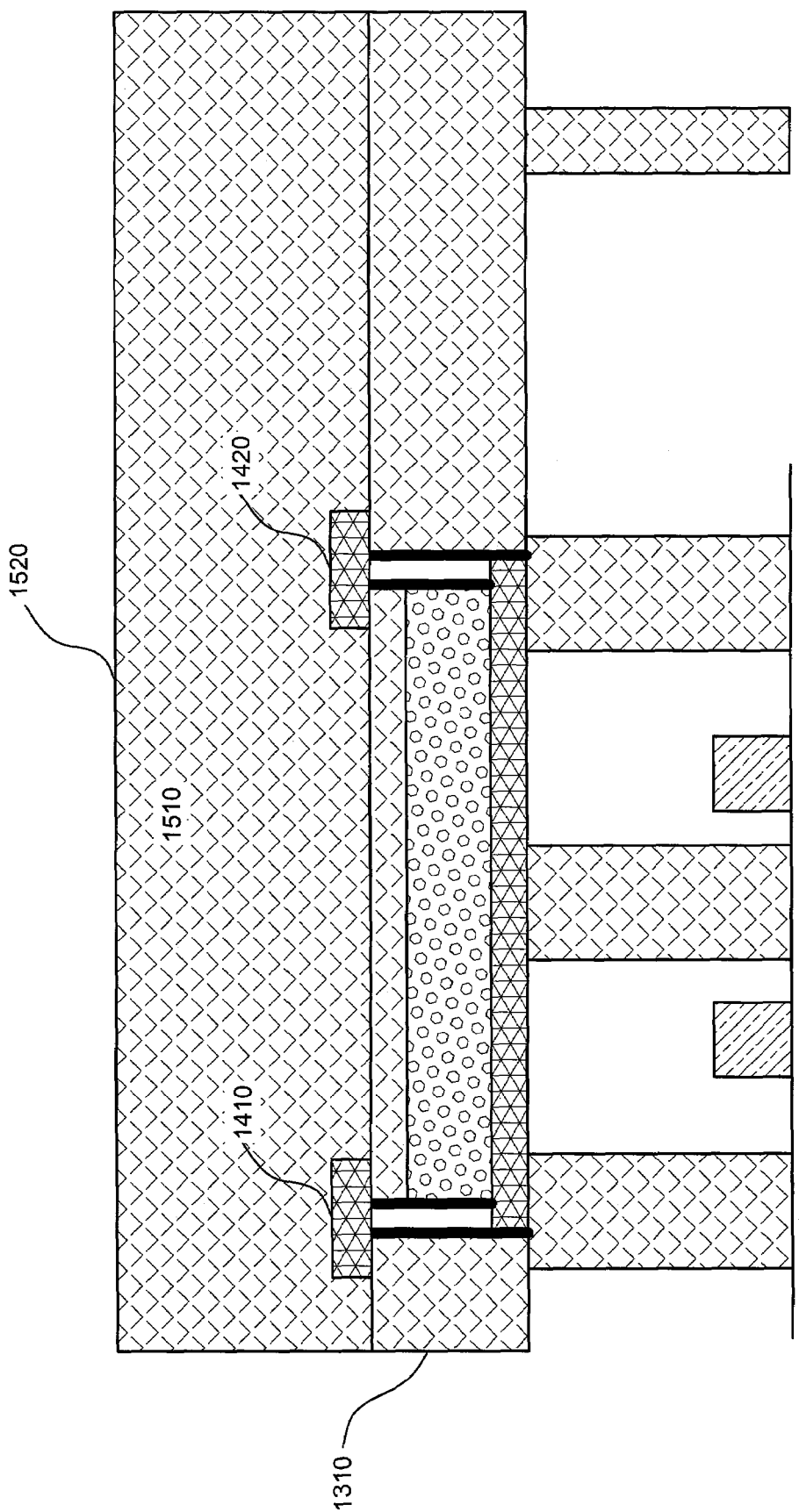
FIG. 15 is a cross-sectional view of a process diagram showing an eleventh step in the manufacturing of the bistable resistive random access memory with the inter-metal dielectric deposition and chemical mechanical polishing in accordance with the present invention.

FIG. 15 is a cross-sectional view of a process diagram showing an eleventh step in the manufacturing of the bistable resistive random access memory with the inter-metal dielectric (IMD) deposition and chemical mechanical polishing (CMP). The inter-metal dielectric 1510 is formed over the first and second programmable resistive material segments 1410, 1420 and the oxide 1310. A chemical mechanical polishing step is carried out to form a planarized surface 1520 of the inter-metal dielectric 1510.

Figure 16:
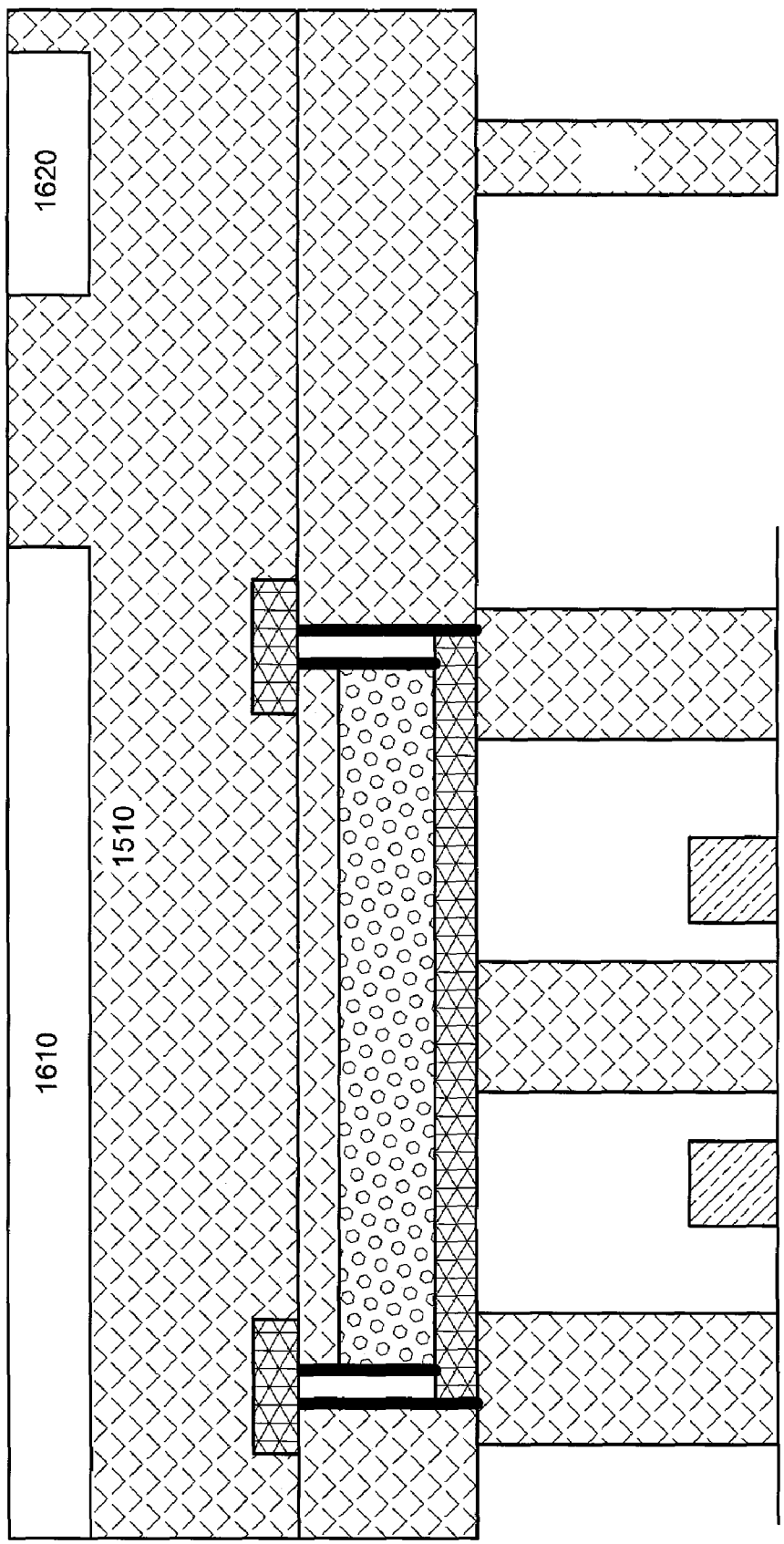
FIGS. 16-18 are cross-sectional views of process diagrams showing a twelfth step, a thirteenth step and a fourteenth step, respectively, in the manufacturing of the bistable resistive random access memory in making interconnects to a bit line and a peripheral element in accordance with the present invention.
Figure 17:
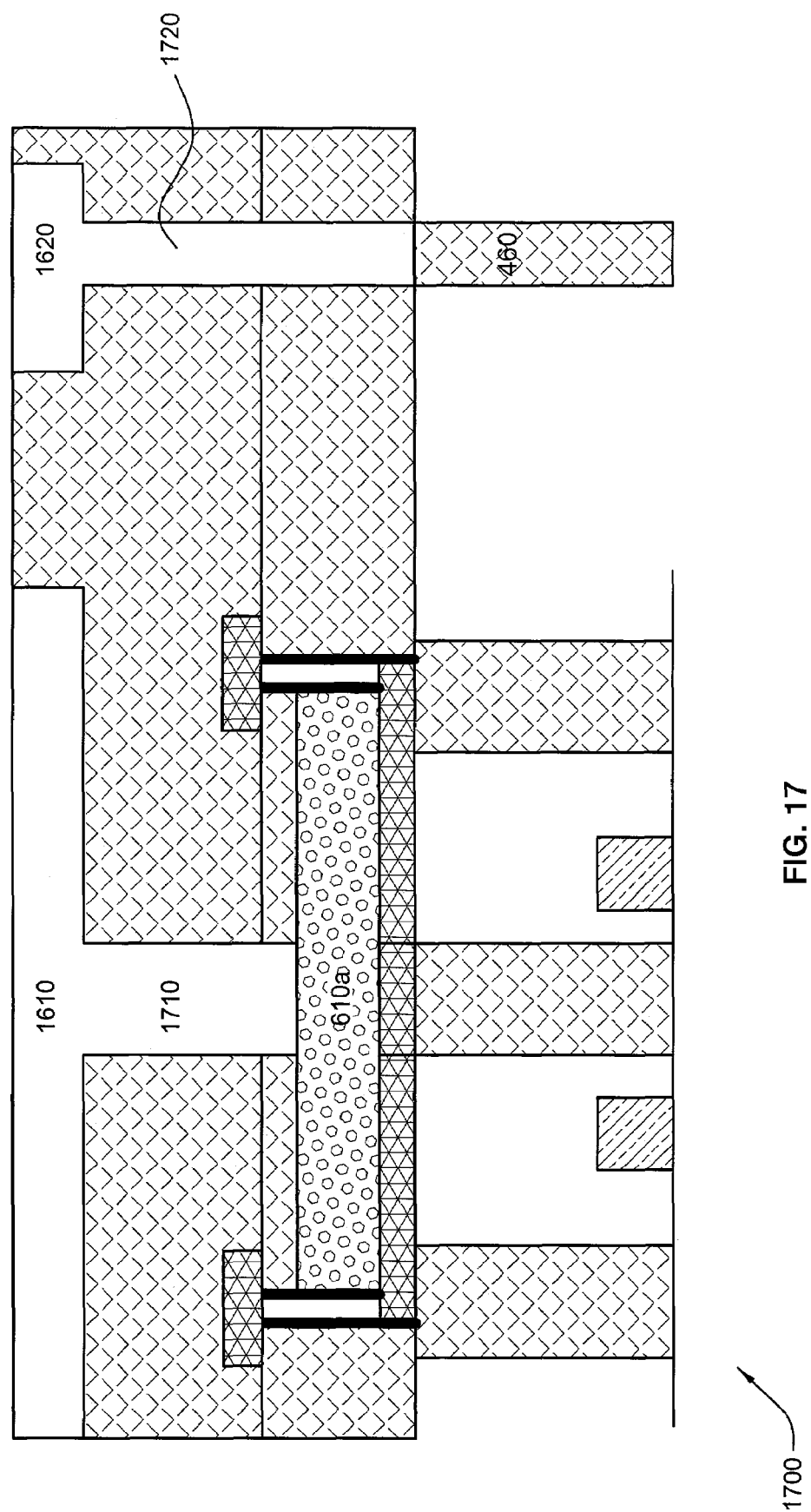
Figure 18:
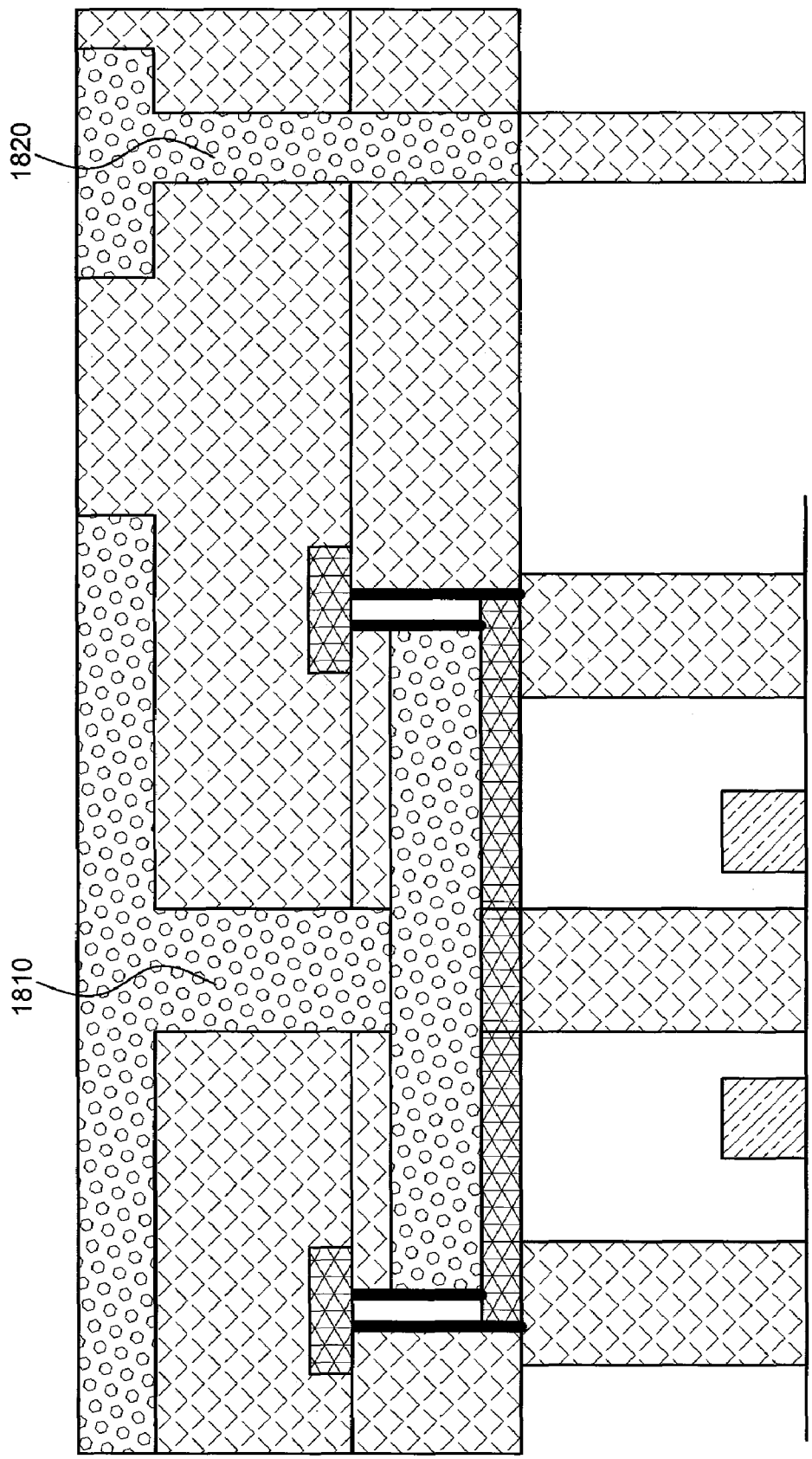

FIGS. 16-18 are cross-sectional views of a process diagram showing a twelfth step, a thirteenth step and a fourteenth step, respectively, in the manufacturing of the bistable resistive random access memory in making interconnects to a bit line and a peripheral element. The patterning of a bit line pocket 1610 and a peripheral pocket 1620 in the inter-metal dielectric 1510 are illustrated in FIG. 16. FIG. 17 shows the patterning of multiple pockets of vias 1710, 1720. The first pocket of via 1810 has the top end that extends to a bottom surface of the bit line pocket 1710, and a bottom end that extends to the top surface of the titanium nitride 610a. The second pocket of via 1820 has the top end that extends to a bottom surface of the peripheral pocket 1720 and a bottom end that extends that extends to the top surface of the peripheral 460. A conductive material 1910, such as copper (Cu), is deposited into the first pocket of via 1810 and the bit line pocket 1710, and a conductive material 1920, such as copper, is deposited into the second pocket of via 1820 and the peripheral pocket 1720, as illustrated in FIG. 19.

For additional information on the manufacture, component materials, use and operation of phase change random access memory devices, see U.S. patent application Ser. No. 11/155, 067 entitled "Thin Film Fuse Phase Change RAM and Manufacturing Method", filed on 17 Jun. 2005, owned by the assignee of this application and incorporated by reference as if fully set forth herein.

The invention has been described with reference to specific exemplary embodiments. Various modifications, adaptations, and changes may be made without departing from the spirit and scope of the invention. Accordingly, the specification and drawings are to be regarded as illustrative of the principles of this invention rather than restrictive, the invention is defined by the following appended claims.

We claim:

1. A method for manufacturing a memory device, comprising:

forming a first dielectric layer, a conductive layer overlying the first dielectric layer, and a second dielectric layer overlying the conductive layer;

patterning the second dielectric layer and the conductive layer having first edges that align substantially near the center of the top surface of a contact plug, the second dielectric layer and the conductive layer having first sidewalls;

forming a first electrode that extends vertically having a first sidewall surface and a second sidewall surface, the first sidewall surface of the first electrode in contact with the first sidewalls of the second dielectric layer and the conductive layer;

forming a sidewall insulating member having a first sidewall surface and a second sidewall surface, the first sidewall surface of the sidewall insulating member in contact with the second sidewall surface of the first electrode;

forming a second electrode that extends vertically having a sidewall surface in contact with the second sidewall surface of the sidewall insulating member, the second electrode formed by depositing an electrode layer overlying the top surface of the sidewall insulating member and the second sidewall of the sidewall insulating member and isotropically etching the electrode layer to form the second electrode; and forming a bridge of memory material between the first electrode and the second electrode across the top surface of the sidewall insulating member, the bridge comprising a patch of memory material contacting the top surface of the first electrode and the top surface of the second electrode to define an inter-electrode path between the first electrode and second electrode having a path length defined by a thickness of the insulating sidewall member.

2. The method of claim 1, prior to forming the first dielectric layer, further comprising a memory common source array structure, wherein the first dielectric layer is formed over the memory common source array structure.

3. The method of claim 1, wherein the patterning step comprises patterning the second dielectric layer and the conductive layer and stopping substantially at the top surface of the first dielectric layer.

4. The method of claim 1, wherein the first electrode comprises titanium nitride.

5. The method of claim 1, wherein the forming step of the sidewall insulating member comprises depositing and etching the sidewall insulating member.

6. The method of claim 1, after the forming step of the sidewall insulating member, further comprising etching the patterning second dielectric layer using a first etching chemistry.

7. The method of claim 6, after the forming step of the second electrode, further comprising depositing a dielectric fill over the conductive layer and adjacent to a sidewall surface of the second electrode.

8. The method of claim 1, wherein the first electrode has a thickness of about 50 Å to 500 Å.

9. The method of claim 1, wherein the sidewall insulating member comprises oxide.

10. The method of claim 1, wherein the sidewall insulating member has a thickness of about 50 Å to 500 Å.

11. The method of claim 1, wherein the second electrode has a thickness of about 50 Å to 500 Å.

12. The method of claim 1, wherein the second electrode comprises titanium nitride.

13. The method of claim 1, wherein the conductive layer comprises titanium nitride.

14. The method of claim 1, wherein the conductive layer has a thickness of about 200 Å to about 2000 Å.

15. The method of claim 1, wherein the first dielectric layer comprises silicon nitride.

16. The method of claim 1, wherein the first dielectric layer has a thickness of about 100 Å to about 1000 Å.

17. The method of claim 1, wherein the second dielectric layer comprises silicon nitride.

18. The method of claim 1, wherein the second dielectric layer has a thickness of about 100 Å to about 1000 Å.

19. The method of claim 1, wherein the resistive memory material bridge comprises a chalcogenide.

20. The method of claim 1, wherein the resistive memory material bridge has at least two solid phases which are reversibly inducible by a current.

21. The method of claim 1, wherein the resistive memory material bridge has at least two solid phases which include a generally amorphous phase and a generally crystalline phase.

22. The method of claim 1, wherein the resistive memory material bridge comprises GeSbTe.

23. The method of claim 1, wherein the resistive memory material bridge comprises a combination of two or more materials from the group of Ge, Sb, Te, Se, In, Ti, Ga, Bi, Sn, Cu, Pd, Pb, Ag, S, or Au.

24. The method of claim 1, wherein the resistive memory material bridge comprises a colossal magnetoresistance material.

25. The method of claim 1, wherein the resistive memory material bridge comprises a two-element compound.

* * * * *